United States Patent
Liao et al.

(10) Patent No.: US 12,324,161 B2
(45) Date of Patent: Jun. 3, 2025

(54) ANNEALED SEED LAYER TO IMPROVE FERROELECTRIC PROPERTIES OF MEMORY LAYER

(71) Applicant: Taiwan Semiconductor Manufacturing Company, Ltd., Hsinchu (TW)

(72) Inventors: Song-Fu Liao, Taipei (TW); Rainer Yen-Chieh Huang, Changhua County (TW); Hai-Ching Chen, Hsinchu (TW); Chung-Te Lin, Tainan (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 18/419,987

(22) Filed: Jan. 23, 2024

(65) Prior Publication Data

US 2024/0164111 A1    May 16, 2024

Related U.S. Application Data

(60) Continuation of application No. 17/882,012, filed on Aug. 5, 2022, now Pat. No. 11,917,831, which is a
(Continued)

(51) Int. Cl.
*H01L 21/02* (2006.01)
*H01L 21/768* (2006.01)
(Continued)

(52) U.S. Cl.
CPC ....... *H10B 51/30* (2023.02); *H01L 21/76876* (2013.01); *H10B 53/30* (2023.02)

(58) Field of Classification Search
CPC .... H10B 51/30; H10B 53/30; H01L 21/76876
See application file for complete search history.

(56) References Cited

U.S. PATENT DOCUMENTS

6,831,313 B2    12/2004  Uchiyama et al.
2003/0080329 A1  5/2003  Kurasawa et al.
(Continued)

FOREIGN PATENT DOCUMENTS

CN    112531112 A    3/2021
JP    2004158714 A   6/2004
(Continued)

OTHER PUBLICATIONS

Gaddam et al. "Ferroelectricity Enhancement in Hf0.5Zr0.5O2 5O2 Capacitors by Incorporating Ta2O5 Dielectric Seed Layers" 2020 IEEE Electron Devices Technology and Manufacturing Conference Proceedings of Technical Papers, published on Jun. 16, 2020.
(Continued)

*Primary Examiner* — Samuel Park
(74) *Attorney, Agent, or Firm* — Eschweiler & Potashnik, LLC

(57) ABSTRACT

In some embodiments, the present disclosure relates to an integrated chip that includes a first conductive structure arranged over a substrate. A memory layer is arranged over the first conductive structure, below a second conductive structure, and includes a ferroelectric material. An annealed seed layer is arranged between the first and second conductive structures and directly on a first side of the memory layer. An amount of the crystal structure that includes an orthorhombic phase is greater than about 35 percent.

20 Claims, 26 Drawing Sheets

Related U.S. Application Data division of application No. 17/184,892, filed on Feb. 25, 2021, now Pat. No. 11,690,228.

(51) Int. Cl.
   *H10B 51/30* (2023.01)
   *H10B 53/30* (2023.01)

(56) References Cited

U.S. PATENT DOCUMENTS

| | | | |
|---|---|---|---|
| 2004/0023416 A1* | 2/2004 | Gilbert | C23C 16/0272 438/785 |
| 2004/0036111 A1 | 2/2004 | Nishikawa et al. | |
| 2012/0207928 A1* | 8/2012 | Dussarrat | H01L 21/0228 427/255.28 |
| 2016/0225979 A1 | 8/2016 | Hsu et al. | |
| 2018/0166453 A1* | 6/2018 | Müller | H01L 28/60 |
| 2018/0337055 A1* | 11/2018 | Yamaguchi | H01L 29/516 |
| 2019/0066917 A1* | 2/2019 | Nahar | H01G 4/30 |
| 2019/0131420 A1* | 5/2019 | Lu | H01L 29/40111 |
| 2019/0386142 A1 | 12/2019 | Gros-Jean et al. | |
| 2020/0020762 A1 | 1/2020 | Frank et al. | |
| 2020/0312950 A1 | 10/2020 | Haratipour et al. | |
| 2022/0157833 A1* | 5/2022 | Kobayashi | H01L 29/78391 |

FOREIGN PATENT DOCUMENTS

| | | |
|---|---|---|
| WO | WO-2018231210 A1 * | 12/2018 |
| WO | 2021024598 A1 | 2/2021 |

OTHER PUBLICATIONS

Onaya et al. "Improvement in ferroelectricity of HfxZr1%xO2 thin films using ZrO2 seed layer" Applied Physics Express 10, 081501 (2017), published on Jul. 13, 2017.

Liu et al. "Structure and Dielectric Property of High-k ZrO2 Films Grown by Atomic Layer Deposition Using Tetrakis(Dimethylamido) Zirconium and Ozone" Nanoscale Research Letters (2019) 14:154, published on May 7, 2019.

Onaya et al. "Improvement in ferroelectricity of HfxZr1—xO2 thin films using top- and bottom-ZrO2 nucleation layers" APL Mater. 7, 061107 (2019), published on Jun. 27, 2019.

Non-Final Office Action dated Oct. 6, 2022 for U.S. Appl. No. 17/184,892.

Notice of Allowance dated Feb. 15, 2023 for U.S. Appl. No. 17/184,892.

Non-Final Office Action dated Jul. 7, 2023 for U.S. Appl. No. 17/882,012.

Notice of Allowance dated Oct. 30, 2023 for U.S. Appl. No. 17/882,012.

* cited by examiner

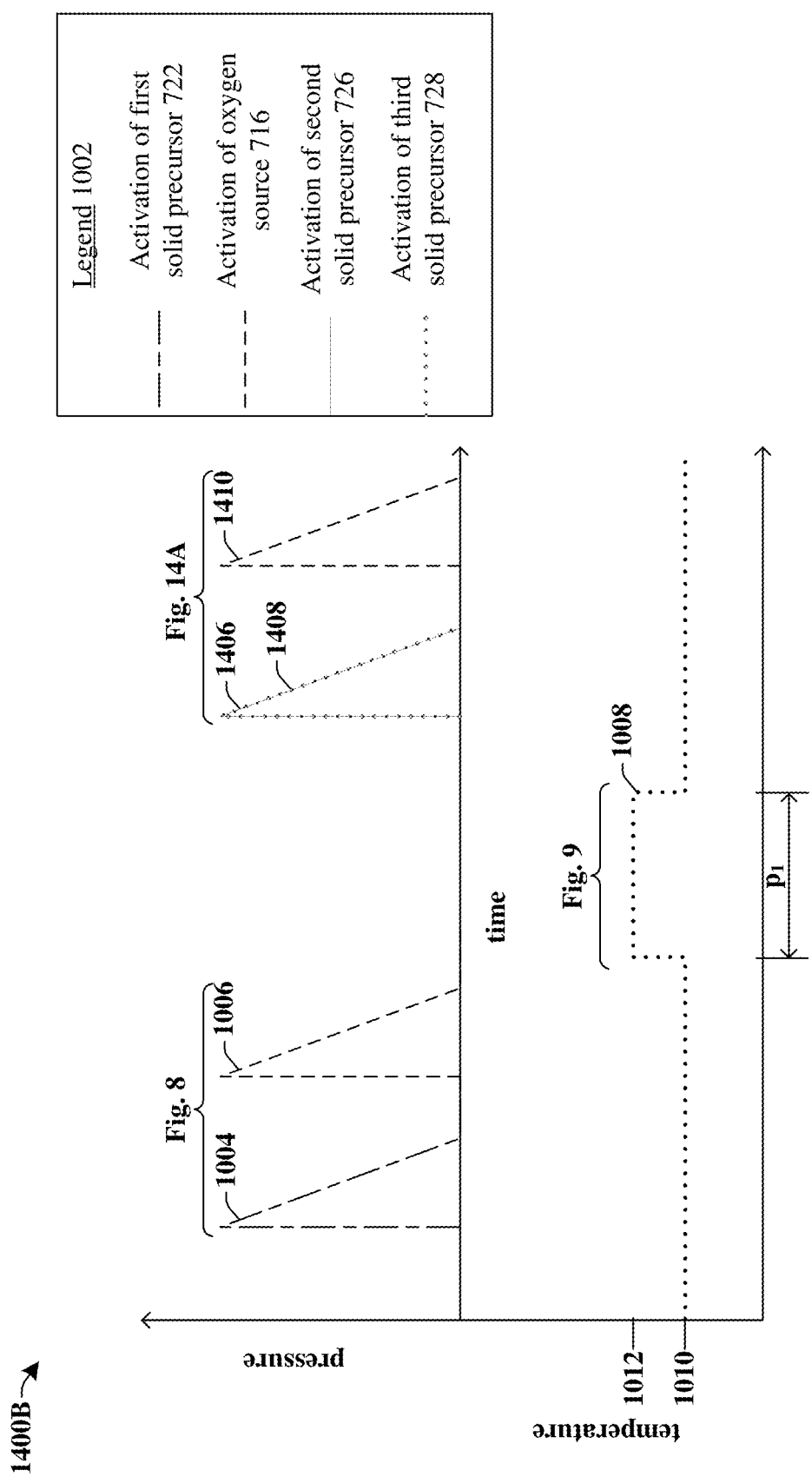

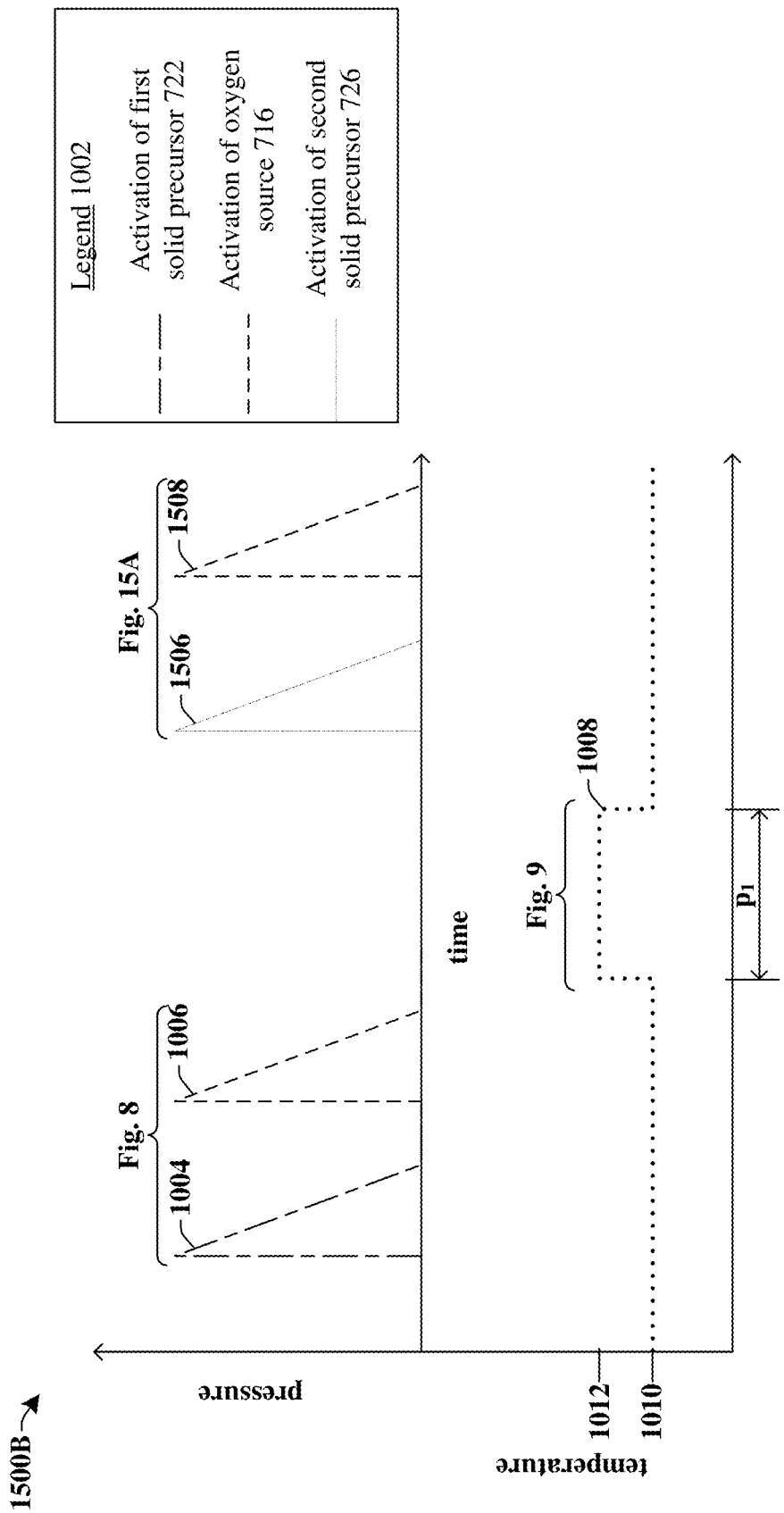

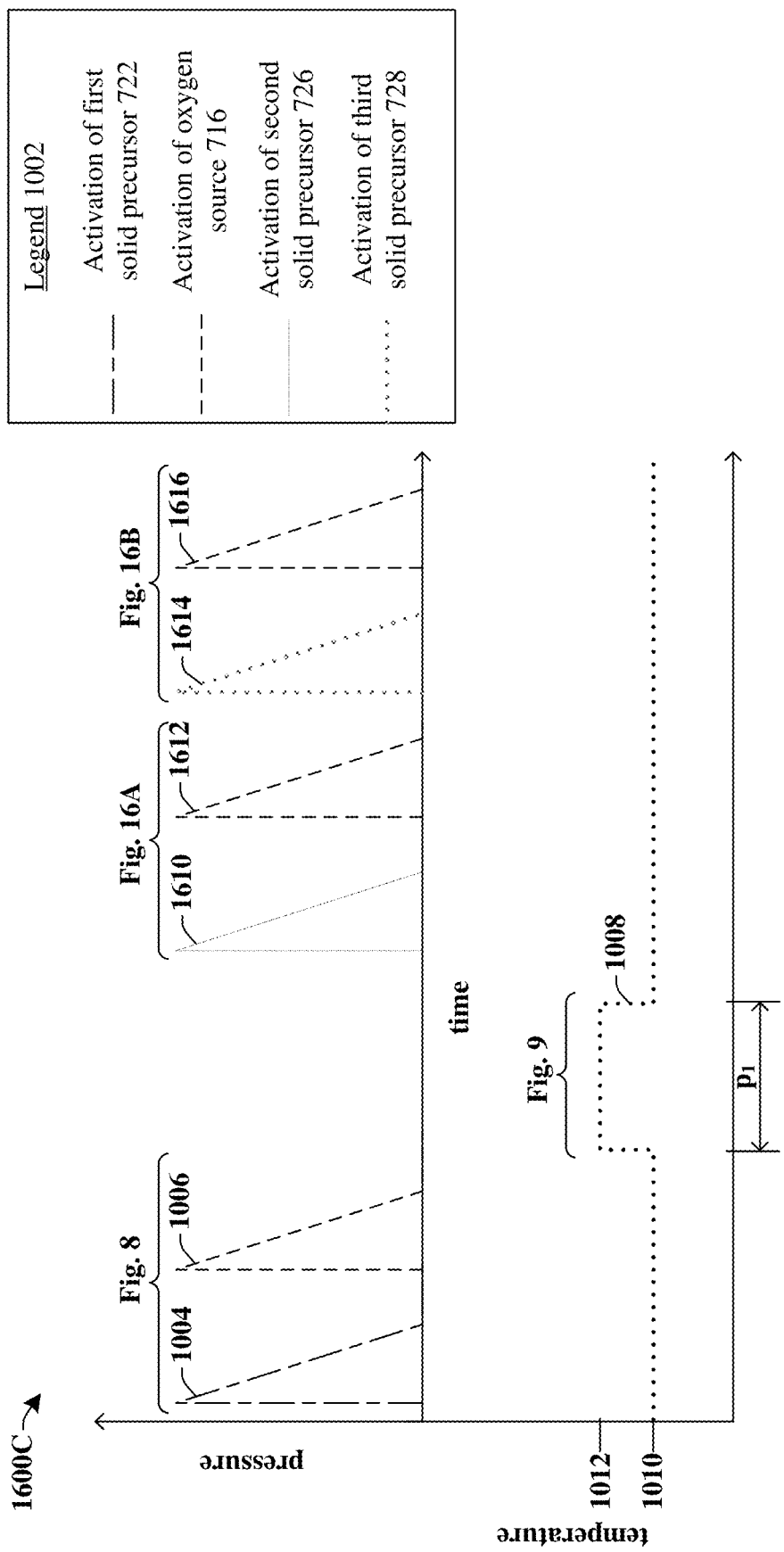

ANNEALED SEED LAYER TO IMPROVE FERROELECTRIC PROPERTIES OF MEMORY LAYER

REFERENCE TO RELATED APPLICATIONS

This Application is a Continuation of U.S. application Ser. No. 17/882,012, filed on Aug. 5, 2022, which is a Divisional of U.S. application Ser. No. 17/184,892, filed on Feb. 25, 2021 (now U.S. Pat. No. 11,690,228, issued on Jun. 27, 2023). The contents of the above-referenced Patent Applications are hereby incorporated by reference in their entirety.

BACKGROUND

Many modern day electronic devices include non-volatile memory. Non-volatile memory is electronic memory that is able to store data in the absence of power. A promising candidate for the next generation of non-volatile memory is ferroelectric random-access memory (FeRAM). FeRAM has a relatively simple structure and is compatible with complementary metal-oxide-semiconductor (CMOS) logic and thin film transistor fabrication processes.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
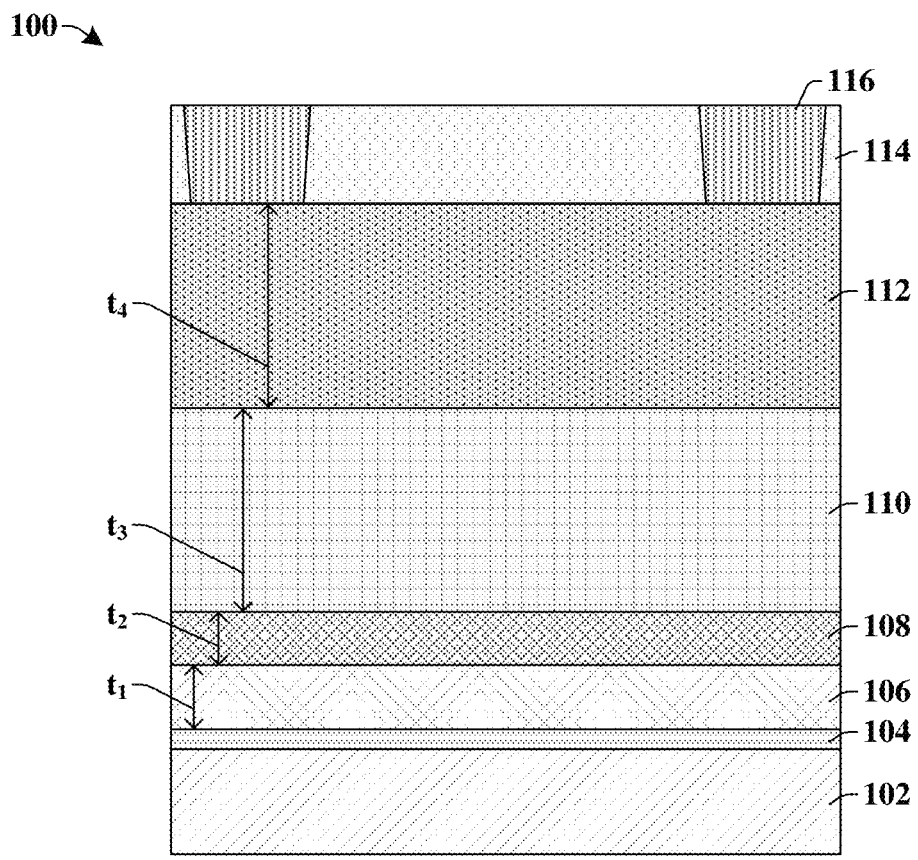
FIG. 1 illustrates a cross-sectional view of some embodiments of a field effect transistor (FET) ferroelectric random access memory (FeRAM) comprising an annealed seed layer below a memory layer.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A thin film transistor (TFT) is a type of field effect transistor (FET) that includes an active layer that may be turned "ON" such that mobile charge carriers flow through the active layer when a sufficient signal (e.g., voltage, current) is applied to source contact, drain contact, and gate electrode of the TFT. In a bottom gate TFT, the gate electrode is arranged below the active layer and the source and drain contacts are arranged over the active layer. A memory layer may separate the gate electrode from the active layer. In some instances, the memory layer comprises a ferroelectric material, such that the TFT functions as a FET ferroelectric random access memory (FeRAM). The memory layer can store data values based on a process of reversible switching between polarizations states because the ferroelectric's crystal structure changes when an electric field is present.

To form a FET FeRAM, a memory layer is formed over a gate electrode. Then, the active layer is formed over the ferroelectric layer, and source and drain contacts are formed over the active layer. In some embodiments, prior to forming the memory layer, a seed layer is formed over the gate electrode. In some embodiments, the crystal structure of the seed layer influences the crystal structure of the memory layer formed over the seed layer. The seed layer may comprise a combination of crystal structure phases such as a cubic phase, an orthorhombic phase, and a tetragonal phase. The memory layer may comprise a combination of crystal structure phases such as a monoclinic phase, a cubic phase, an orthorhombic phase, and a tetragonal phase. Typically, the orthorhombic phase of the memory layer's crystal structure is the phase that allows the memory layer to have ferroelectric abilities (e.g., ability to switch between polarization states). Thus, the memory layer is more reliable and has faster switching speeds when the orthorhombic phase of the memory layer is increased.

Various embodiments of the present disclosure relate to performing an annealing process after the formation of the seed layer to increase the orthorhombic phase of the seed layer's crystal structure such that when the memory layer is formed over the annealed seed layer, the memory layer also has a crystal structure with a higher instance of the orthorhombic phase. In some embodiments, the seed layer is annealed using an in-situ annealing process, wherein the temperature of the wafer chuck or processing chamber that the seed layer is formed on is increased to anneal the seed layer. In some other embodiments, the seed layer may be annealed under conditions that are not in-situ with the processing chamber, such as in a rapid thermal annealing furnace. Nevertheless, the annealed seed layer has a higher instance of the orthorhombic phase compared to the seed layer prior to annealing. Therefore, when the memory layer is formed on the annealed seed layer, the memory layer has a higher instance of the orthorhombic phase compared to if the memory layer were formed on the seed layer prior to annealing. Because the memory layer has a higher instance of the orthorhombic phase, the ability of the memory layer to switch between polarization states, and thus, store memory, is increased.

FIG. 1 illustrates a cross-sectional view 100 of some embodiments of an integrated chip comprising a field effect transistor (FET) ferroelectric random access memory (FeRAM) device having a memory layer arranged over an annealed seed layer.

The cross-sectional view 100 of FIG. 1 includes a gate electrode 106 arranged over a substrate 102. In some embodiments, a dielectric layer 104 is arranged between the gate electrode 106 and the substrate 102. In some embodiments, an annealed seed layer 108 is arranged over the gate electrode 106, and a memory layer 110 is arranged over and directly contacts the annealed seed layer 108. In some embodiments, the annealed seed layer 108 comprises a metal oxide, and the memory layer 110 comprises a ferroelectric material. In some embodiments, an active layer 112 is arranged over the memory layer 110 and comprises a semiconductor material. In some embodiments, source/drain contacts 116 are arranged over and coupled to the active layer 112. In some embodiments, the source/drain contacts 116 are laterally spaced apart from one another by an interconnect dielectric layer 114 that is arranged on the active layer 112. Thus, in some embodiments, the active layer 112 may be turned "ON" to form a channel region of mobile charge carriers when control circuitry applies a sufficient voltage bias across the active layer 112 through the source/drain contacts 116 and the gate electrode 106. In some such embodiments, the mobile charge carriers may be controlled by the control circuitry to read and write data from the memory layer 110 because the memory layer 110 comprises a ferroelectric material. The ferroelectric material of the memory layer 110 switches between polarizations states that correspond to different resistances because the ferroelectric's crystal structure changes when an electric field from the channel region is present.

In some embodiments, the gate electrode 106 has a first thickness $t_1$ in a range of between, for example, approximately 50 nanometers and approximately 200 nanometers. In some embodiments, an annealed seed layer 108 is arranged over the gate electrode 106 and has a second thickness $t_2$ in a range of between, for example, approximately 0.1 nanometers and approximately 5 nanometers. In some embodiments, the annealed seed layer 108 comprises a first metal oxide material. In some embodiments, the annealed seed layer 108 comprises oxygen and a metal of the gate electrode 106. For example, in some embodiments, the gate electrode 106 comprises tantalum, and the annealed seed layer 108 comprises tantalum oxide. In other embodiments, the annealed seed layer 108 comprises oxygen and a different metal than the gate electrode 106. For example, in some embodiments, the gate electrode 106 comprises titanium, and the annealed seed layer 108 comprises zirconium oxide. In some other embodiments, the annealed seed layer 108 may comprise, for example, zirconium yttrium oxide, aluminum oxide, hafnium zirconium oxide, hafnium oxide, or some other suitable metal oxide material.

Further, in some embodiments, the annealed seed layer 108 comprises a single layer, whereas in some other embodiments (not shown), the annealed seed layer 108 may comprise multiple layers of materials. For example, in some embodiments, if the annealed seed layer comprises yttrium zirconium oxide, the annealed seed layer 108 may comprise a single layer that is a mixture of yttrium oxide and zirconium oxide, or may comprise yttrium oxide layers arranged over and/or under zirconium oxide layers.

In some embodiments, the memory layer 110 has a third thickness $t_3$ in a range of between, for example, approximately 9 nanometers and approximately 12 nanometers. In some embodiments, the active layer 112 has a fourth thickness $t_4$ in a range of between, for example, approximately 10 nanometers and approximately 12 nanometers. In some embodiments, the memory layer 110 comprises hafnium zirconium oxide or some other suitable ferroelectric material. In some embodiments, the memory layer 110 comprises a mixture of a first metal oxide and a second metal oxide, such as, for example, hafnium oxide and zirconium oxide. In some such embodiments, both the first metal oxide and the second metal oxide directly contact the annealed seed layer 108.

In some embodiments, the memory layer 110 directly contacts and is formed on the annealed seed layer 108 because the crystal structure of the memory layer 110 is more predictable and controlled when formed on the annealed seed layer 108 than directly on the gate electrode 106. In some embodiments, the ferroelectric properties of the memory layer 110 improve when the percent of the crystal structure of the memory layer 110 that is the orthorhombic phase increases. In some embodiments, the crystal structure of a material may be measured by x-ray diffraction to determine which phases are present in the material and relatively how much of each phase is present in the material. In some embodiments, the annealed seed layer 108 was annealed prior to forming the memory layer 110 because annealing the annealed seed layer 108 increases the number of orthorhombic phases in the crystal structure of the annealed seed layer 108. Then, in some embodiments, more orthorhombic phases in the crystal structure of the memory layer 110 are present when the memory layer 110 is formed on the annealed seed layer 108 with a higher number of orthorhombic phases. Therefore, the ferroelectric properties of the memory layer 110 are improved due to an increase in orthorhombic phases in the memory layer 110, which increase switching speeds and overall reliability of the FET FeRAM.

Figure 2A:
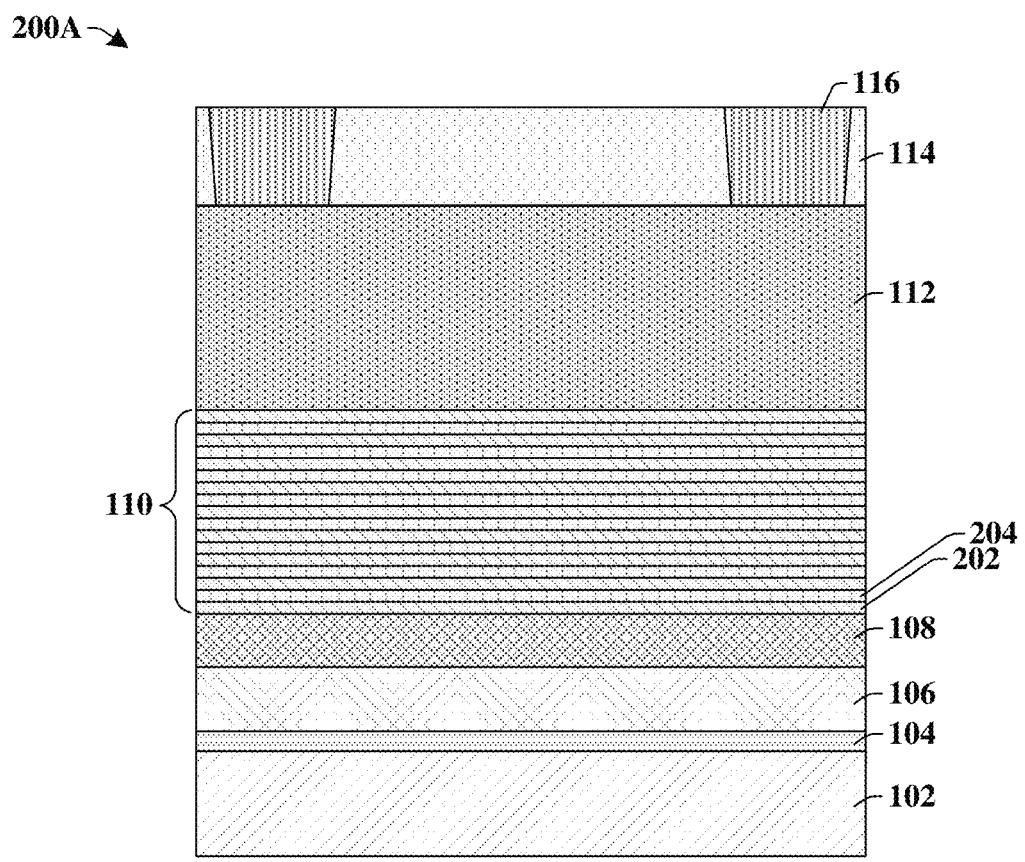
FIGS. 2A-C illustrate cross-sectional views of some other embodiments of FIG. 1, wherein the memory layer comprises multiple layers of memory materials.

FIG. 2A illustrates a cross-sectional view 200A of some embodiments of a FET FeRAM having a memory layer arranged over an annealed seed layer, wherein the memory layer comprises multiple layers.

In some embodiments, the memory layer 110 may comprise a first memory material layer 202 comprising the first metal oxide and a second memory material layer 204 comprising the second metal oxide. In some such embodiments, the first and second memory material layers 202, 204 may be arranged in alternating order with one another. For example, in some embodiments, each first memory material layer 202 contacts at least one second memory material layer 204. In some embodiments, the memory layer 110 comprises multiples of the first and second memory material layers 202, 204. It will be appreciated that other embodiments may comprise more or less than the number of first and second memory material layers 202, 204 than what is illustrated in FIG. 2A.

Nevertheless, in some embodiments, if the annealed seed layer 108 comprises many orthorhombic phases, the first and second memory material layers 202, 204 of the memory layer 110 may also comprise many orthorhombic phases when formed over the annealed seed layer 108. In some embodiments, at least 35 percent of the crystal structure of the annealed seed layer 108 comprises the orthorhombic phase. Similarly, in some embodiments, at least 35 percent of the crystal structure of the overall memory layer 110 comprises the orthorhombic phase.

Figure 2B:
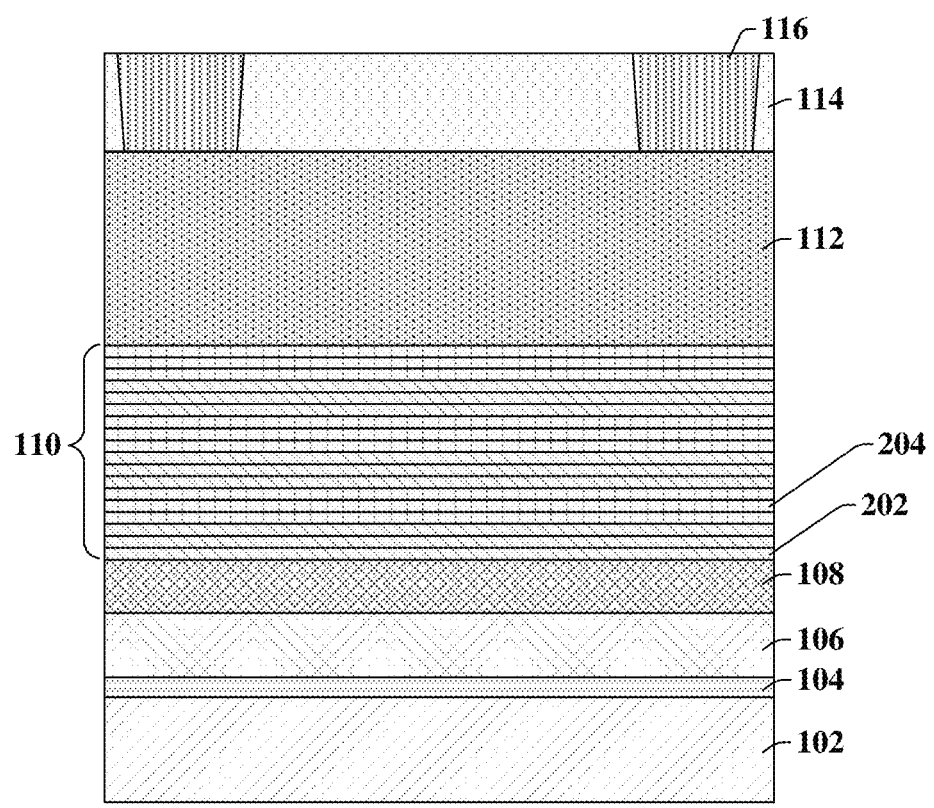

FIG. 2B illustrates a cross-sectional view 200B of some other embodiments of a FET FeRAM having a memory layer arranged over an annealed seed layer, wherein the memory layer comprises multiple layers.

In some other embodiments, the memory layer 110 may comprise a different pattern of the stacking of the first and second memory material layers 202, 204. For example, in some embodiments, multiple first memory material layers 202 may be formed on the annealed seed layer 108, and then multiple second memory material layers 204 may be formed on the multiple first memory material layers 202. Specifically, in the cross-sectional view 200B of FIG. 2B, in some embodiments, three of the first memory material layers 202 are arranged on the annealed seed layer 108, and three of the second memory material layers 204 are arranged on the three of the first memory material layers 202. In some embodiments, another three of the first memory material layers 202 are arranged on the three of the second memory material layers 204, and so on. It will be appreciated that in some other embodiments, one of the second memory material layers 204 may be arranged directly on the annealed seed layer 108.

Figure 2C:
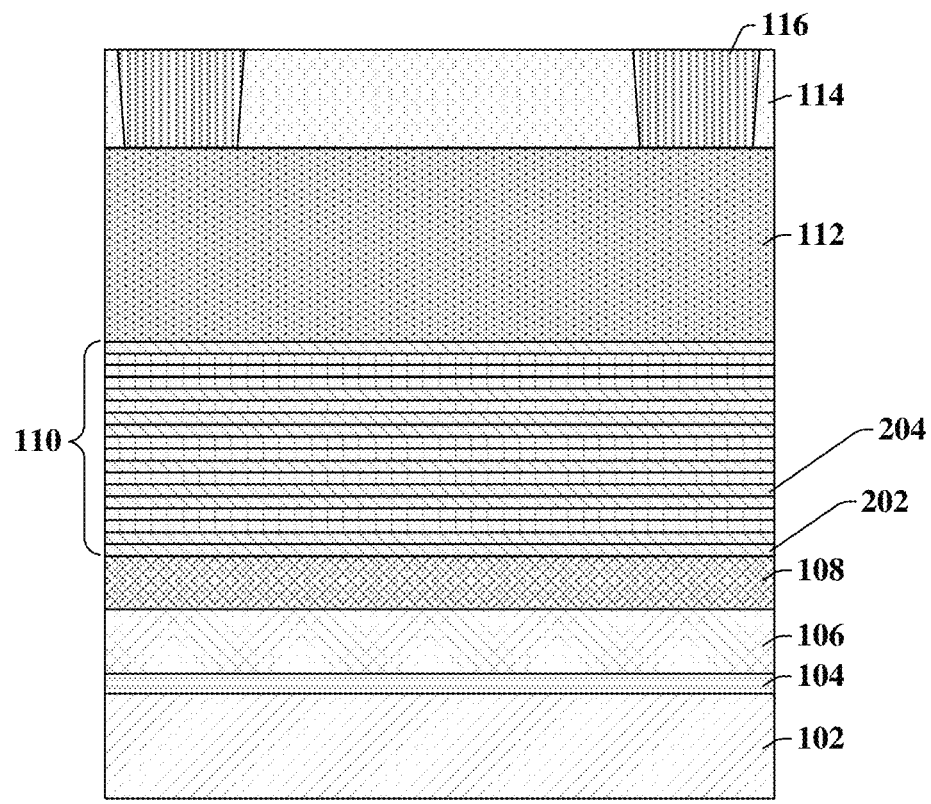

FIG. 2C illustrates a cross-sectional view 200C of yet some other embodiments of a FET FeRAM having a memory layer arranged over an annealed seed layer, wherein the memory layer comprises multiple layers.

In yet some other embodiments, the arrangement of the first memory material layer 202 and the second memory material layer 204 over the annealed seed layer 108 may be random and thus, not follow some type of pattern as described, for example, in FIGS. 2B and 2C.

Further, in some embodiments, it will be appreciated that the active layer 112 may comprise a semiconductor material that also comprises metal oxides, such as, for example, indium gallium zinc oxide. In some such embodiments, the active layer 112 may comprise a mixture of metal oxides or separate layers of each metal oxide similar to what is described in FIGS. 2A-C with respect to the first and second memory material layers 202, 204 of the memory layer 110.

Figure 3:
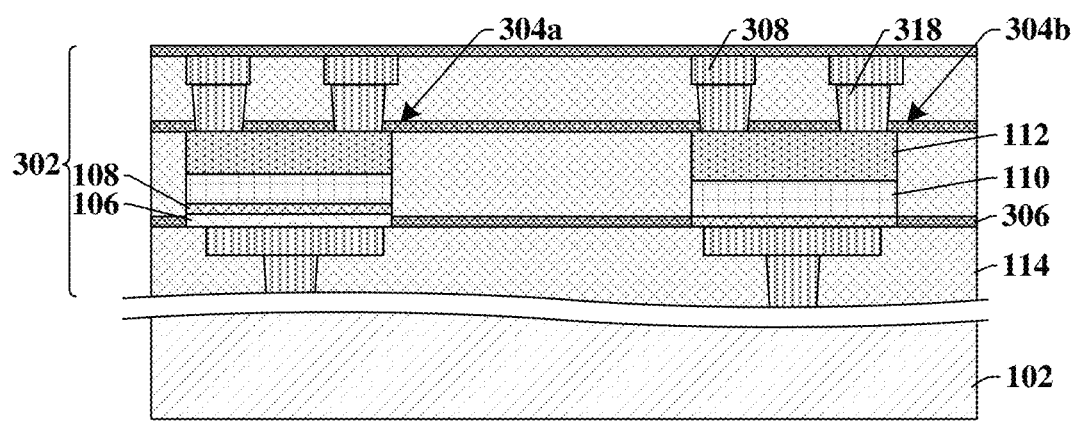
FIG. 3 illustrates a cross-sectional view of some embodiments of a FET FeRAM embedded within an interconnect structure.

FIG. 3 illustrates a cross-sectional view 300 of some embodiments an integrated chip comprising a FET FeRAM embedded within an interconnect structure.

In some embodiments, the FET FeRAM is arranged within an interconnect structure 302 that is arranged over the substrate 102. In some embodiments, the interconnect structure 302 comprises interconnect contacts 318 and interconnect wires 308 disposed within interconnect dielectric layers 114 and etch stop layers 306. In some embodiments, the interconnect contacts 318 and the interconnect wires 308 may comprise, for example, aluminum, tungsten, copper, tantalum, titanium, or some other suitable conductive material. In some embodiments, the interconnect dielectric layers 114 may comprise, for example, a nitride (e.g., silicon nitride, silicon oxynitride), a carbide (e.g., silicon carbide), an oxide (e.g., silicon oxide), borosilicate glass (BSG), phosphoric silicate glass (PSG), borophosphosilicate glass (BPSG), a low-k oxide (e.g., a carbon doped oxide, SiCOH), or the like. In some embodiments, the etch stop layers 306 may comprise, for example, silicon carbide, silicon nitride, or some other suitable dielectric material.

As shown in FIG. 3, a first FET FeRAM 304a and a second FET FeRAM 304b are arranged within the interconnect structure 302. In some embodiments, the interconnect contacts 318 are arranged over and coupled to the active layer 112 such that the interconnect contacts 318 serve as the source/drain contacts (116 of FIG. 1) of the FET FeRAM (e.g., 304a, 304b). In some embodiments, as shown with the first FET FeRAM 304a, the gate electrode 106 is arranged over one of the interconnect wires 308. In other embodiments, the gate electrode 106 may be arranged over one of the interconnect contacts 318. In some embodiments, as shown with the second FET FeRAM 304b, the gate electrode 106 is omitted, and instead, the annealed seed layer 108 is arranged directly on one of the interconnect wires 308 of the interconnect structure 302.

In some embodiments, due to the small vertical dimensions of the FET FeRAMs (e.g., 304, 304b), the FET FeRAMs may be integrated into the interconnect structure 302 of an integrated chip and controlled by the network of interconnect wires 308 and interconnect contacts 318 of the interconnect structure 302 to store data within the memory layers 110.

Figure 4:
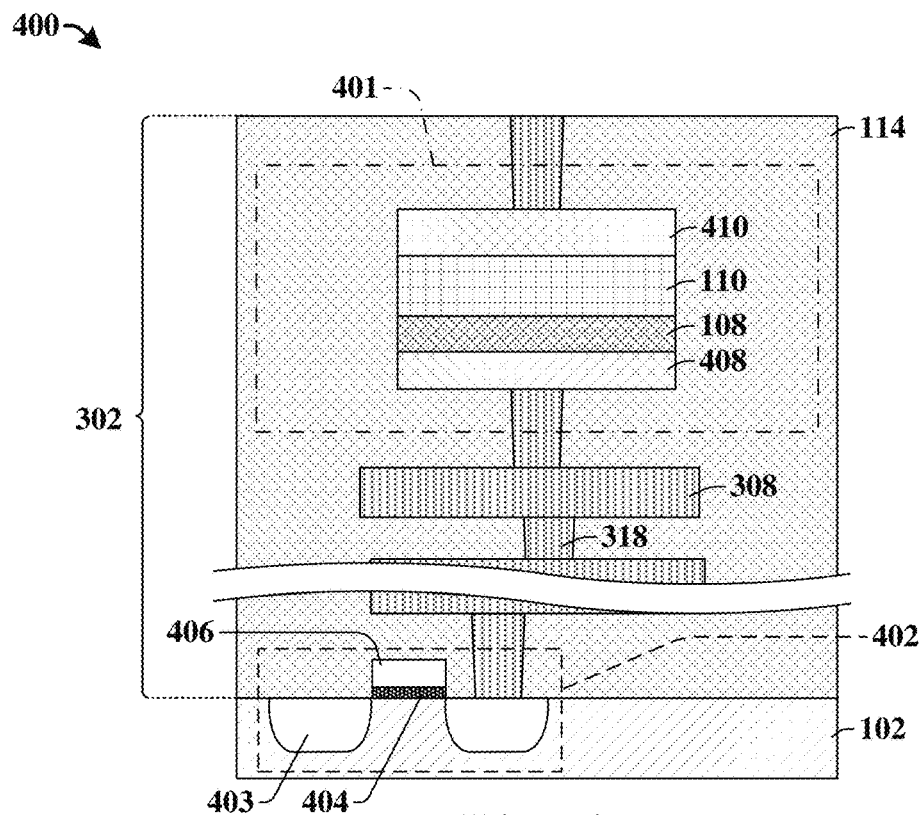
FIGS. 4 and 5 illustrate cross-sectional views of some embodiments of a metal ferroelectric metal (MFM) capacitor comprising an annealed seed layer directly contacting the memory layer.

FIG. 4 illustrates a cross-sectional view 400 of some embodiments of metal ferroelectric metal (MFM) capacitor comprising an annealed seed layer arranged below the memory layer.

In some embodiments, the annealed seed layer 108 may be incorporated into a MFM capacitor 401 such that the memory layer 110 in the MFM capacitor 401 has improved ferroelectric properties. In some embodiments, the MFM capacitor 401 comprises the memory layer 110 arranged between a bottom electrode 408 and a top electrode 410. In some embodiments, the annealed seed layer 108 is arranged below the memory layer 110 and thus, arranged directly between the memory layer 110 and the bottom electrode 408.

In some embodiments, the MFM capacitor 401 is arranged within an interconnect structure 302 and is coupled and controlled by a transistor device 402 through the interconnect wires 308 and the interconnect contacts 318 of the interconnect structure 302. Thus, in some embodiments, interconnect wires 308 and/or interconnect contacts 318 are coupled to the top and bottom electrodes 410, 408. In some embodiments, the transistor device 402 may comprise a metal oxide semiconductor field effect transistor (MOSFET) arranged on and within the substrate 102. In some embodiments, the transistor device 402 comprises source/drain regions 403 within the substrate 102, and a MOSFET gate electrode 406 arranged over the substrate 102 and between the source/drain regions 403. In some embodiments, a gate dielectric layer 404 separates the MOSFET gate electrode 406 from directly contacting the substrate 102. In other embodiments, the transistor device 402 may be or comprise a gate all around FET (GAAFET), a finFET, or some other transistor or semiconductor device. Further, it will be appreciated that in some other embodiments, the annealed seed layer 108 may be incorporated into other MFM devices such as, for example, metal ferroelectric metal insulator FET (MFMIFET) FeRAM devices.

Figure 5:
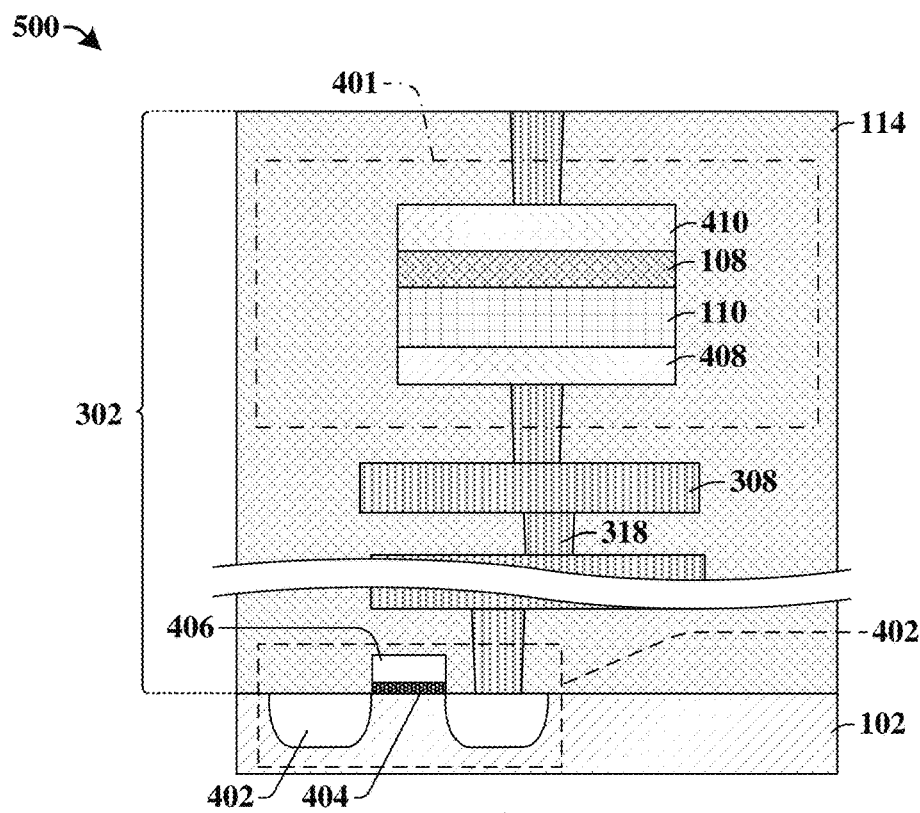

FIG. 5 illustrates a cross-sectional view 500 of some embodiments of metal ferroelectric metal (MFM) capacitor comprising an annealed seed layer arranged above the memory layer.

In some other embodiments, the annealed seed layer 108 may be arranged above the memory layer 110 and thus, be arranged directly between the memory layer 110 and the top electrode 410 in the MFM capacitor 401. In some such embodiments, the MFM capacitor 401 may be formed prior to being integrated into the interconnect structure 302 such that during formation of the MFM capacitor 401, the memory layer 110 is formed directly on the annealed seed layer 108 to increase the orthorhombic phases in the crystal structure of the memory layer 110. In some other embodiments, the memory layer 110 may be formed prior to the annealed seed layer 108 such that the memory layer 110 is also annealed during the formation of the annealed seed layer 108 to increase the orthorhombic phases in the crystal structure of the memory layer 110.

In some other embodiments (not shown), the annealed seed layer 108 may be arranged above and below the memory layer 110. Further, in yet some other embodiments (not shown), the annealed seed layer 108 may be arranged within the memory layer 110 and thus, a first portion of the memory layer 110 may be arranged above the annealed seed layer 108, and a second portion of the memory layer 110 may be arranged below the annealed seed layer 108. Nevertheless, the memory layer 110 may be formed directly on the annealed seed layer 108 to improve ferroelectric properties of the memory layer 110 to improve performance of the overall MFM capacitor 401.

FIGS. 6-19 illustrate various views 600-1900 of some embodiments of a method of forming a FET FeRAM, wherein a memory layer is formed over an annealed seed layer to increase the reliability of the FET FeRAM. Although FIGS. 6-19 are described in relation to a method, it will be appreciated that the structures disclosed in FIGS. 6-19 are not limited to such a method, but instead may stand alone as structures independent of the method.

Figure 6:
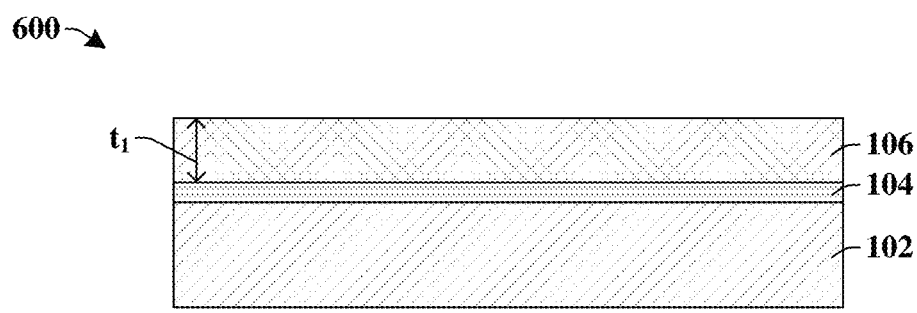
FIGS. 6-19 illustrate various views of some embodiments of methods of forming a FET FeRAM comprising a memory layer arranged over an annealed seed layer.

As shown in cross-sectional view 600 of FIG. 6, in some embodiments, a gate electrode 106 is formed over a substrate 102. In various embodiments, the substrate 102 may comprise any type of semiconductor body (e.g., silicon/CMOS bulk, SiGe, SOI, etc.) such as a semiconductor wafer or one or more die on a wafer, as well as any other type of semiconductor and/or epitaxial layers formed thereon and/or otherwise associated therewith. In some other embodiments, the substrate 102 may comprise a support transparent material, such as a glass, for use in optical applications.

In some embodiments, the gate electrode 106 is formed over the substrate 102 by way of a deposition process (e.g., physical vapor deposition (PVD), chemical vapor deposition (CVD), atomic layer deposition (ALD), direct current sputtering, etc.). In some embodiments, the gate electrode 106 comprises titanium nitride, tantalum, tantalum nitride, or some other suitable conductive material. In some embodiments, the gate electrode 106 is formed to have a first thickness $t_1$ in a range of between, for example, approximately 50 nanometers and approximately 200 nanometers.

Further, in some embodiments, prior to forming the gate electrode 106, a dielectric layer 104 may be formed directly on the substrate 102. In some embodiments, the dielectric layer 104 is formed by way of a deposition process (e.g., PVD, CVD, ALD, etc.). In some embodiments, the dielectric layer 104 may comprise, for example, silicon dioxide, silicon oxynitride, or some other suitable dielectric layer.

Figure 7:
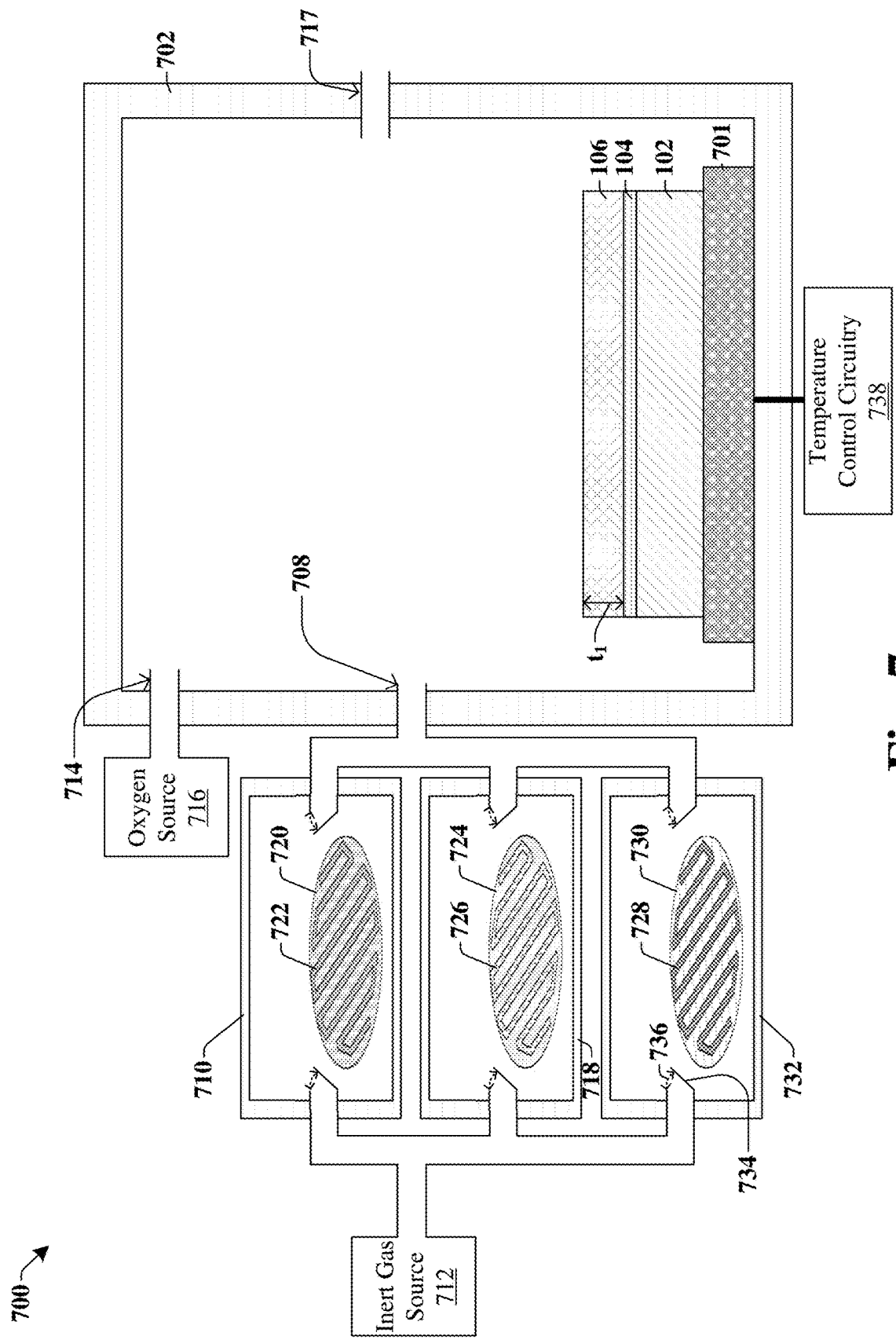

As shown in cross-sectional view 700 of FIG. 7, the substrate 102 is transferred onto a wafer chuck 701 within a reaction chamber defined by chamber housing 702. In some embodiments, the reaction chamber is an atomic layer deposition (ALD) chamber, low pressure vessel, and/or the like. In some embodiments, the substrate 102 was already present in the reaction chamber during the formation of the gate electrode 106 and/or the dielectric layer 104 formed in FIG. 6. In some embodiments, a first gas inlet line 708 passes through the chamber housing 702. In some embodiments, a first precursor vessel 710, a second precursor vessel 718, and/or a third precursor vessel 732 are coupled to the reaction chamber through the first gas inlet line 708. In some other embodiments, each precursor vessel (e.g., 710, 718, 732) is connected to the reaction chamber by way of separate gas inlet lines (e.g., 708). In some embodiments, each precursor vessel (e.g., 710, 718, 732) is also connected to an inert gas source 712. In some embodiments, door-like structures 734 may be coupled to piping that connects the precursor vessels (e.g., 710, 718, 732) to the first gas inlet line 708 and the inert gas source 712 such that the door-like structures 734 may be opened/closed 736 by control circuitry depending on when each precursor vessel (e.g., 710, 718, 732) is to be accessed.

In some embodiments, a first precursor plate 720 is arranged within the first precursor vessel 710. In some embodiments, a first solid precursor 722 is arranged within grooves of the first precursor plate 720. In some embodiments, a second precursor plate 724 is arranged within the second precursor vessel 718. In some embodiments, a second solid precursor 726 is arranged within grooves of the second precursor plate 724. In some embodiments, a third precursor plate 730 is arranged within the third precursor vessel 732. In some embodiments, a third solid precursor 728 is arranged within grooves of the third precursor plate 730. In some embodiments, the first, second, and third solid precursors 722, 726, 728 may be activated when exposed to the inert gas source 712 to form a layer on the gate electrode 106 through an ALD process. In some other embodiments, more or less than three precursor vessels (e.g., 710, 718, 732) are coupled to the reaction chamber.

In some embodiments, a second gas inlet line 714 passes through the chamber housing 702 such that an oxygen source 716 can enter the reaction chamber upon activation by control circuitry. In some embodiments, a gas outlet line 717 passes through the chamber housing 702 such that various gases can exit the reaction chamber during deposition processes.

Further, in some embodiments, temperature control circuitry 738 is coupled to the reaction chamber. In some embodiments, the temperature control circuitry 738 is coupled to the wafer chuck 701 to control the temperature of the wafer chuck 701, whereas in some other embodiments, the temperature control circuitry 738 is within the chamber housing 702 to control the temperature of the reaction chamber as a whole. In some other embodiments, the temperature control circuitry 738 may be omitted.

Figure 8:
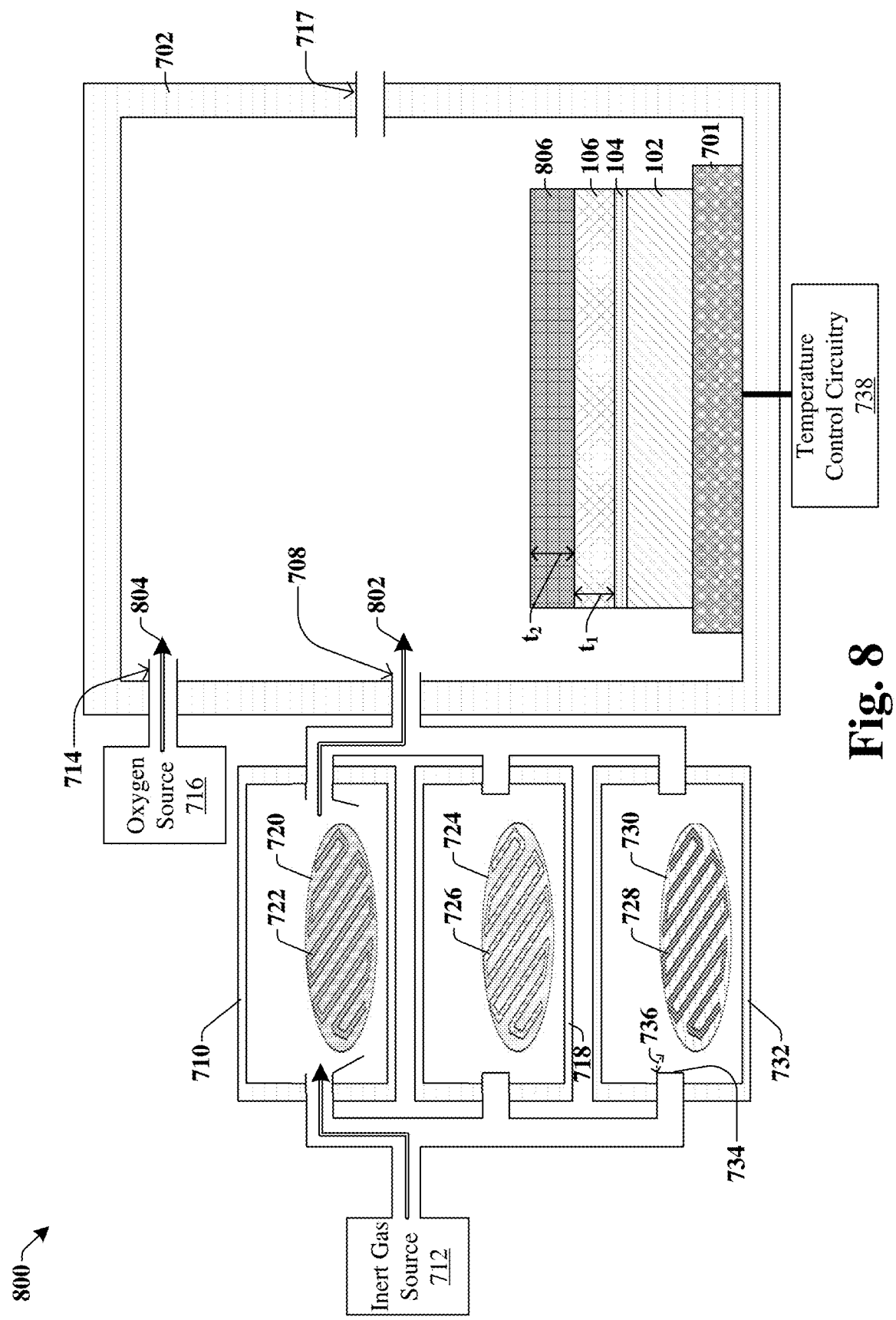
Figure 9:
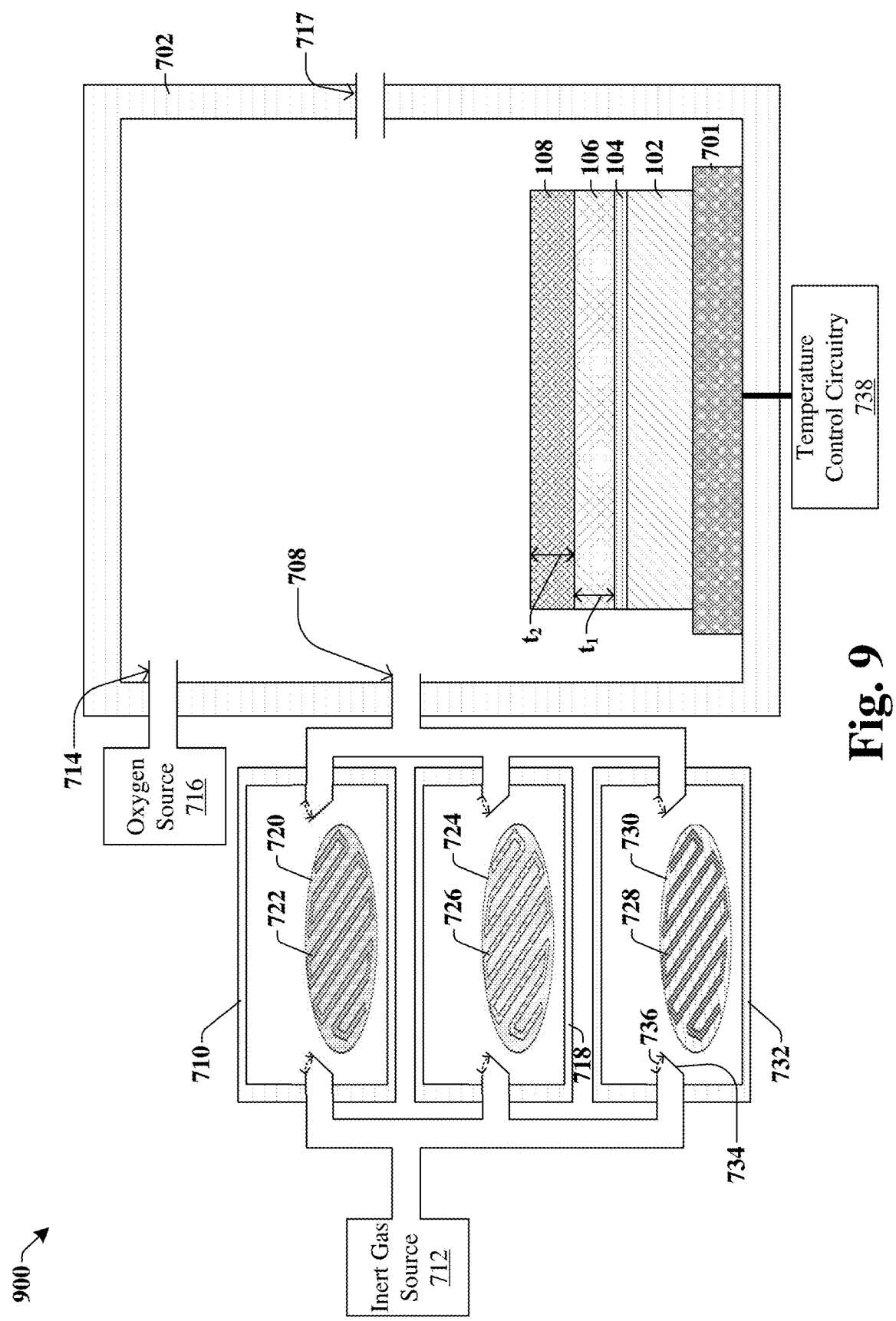
Figure 10:
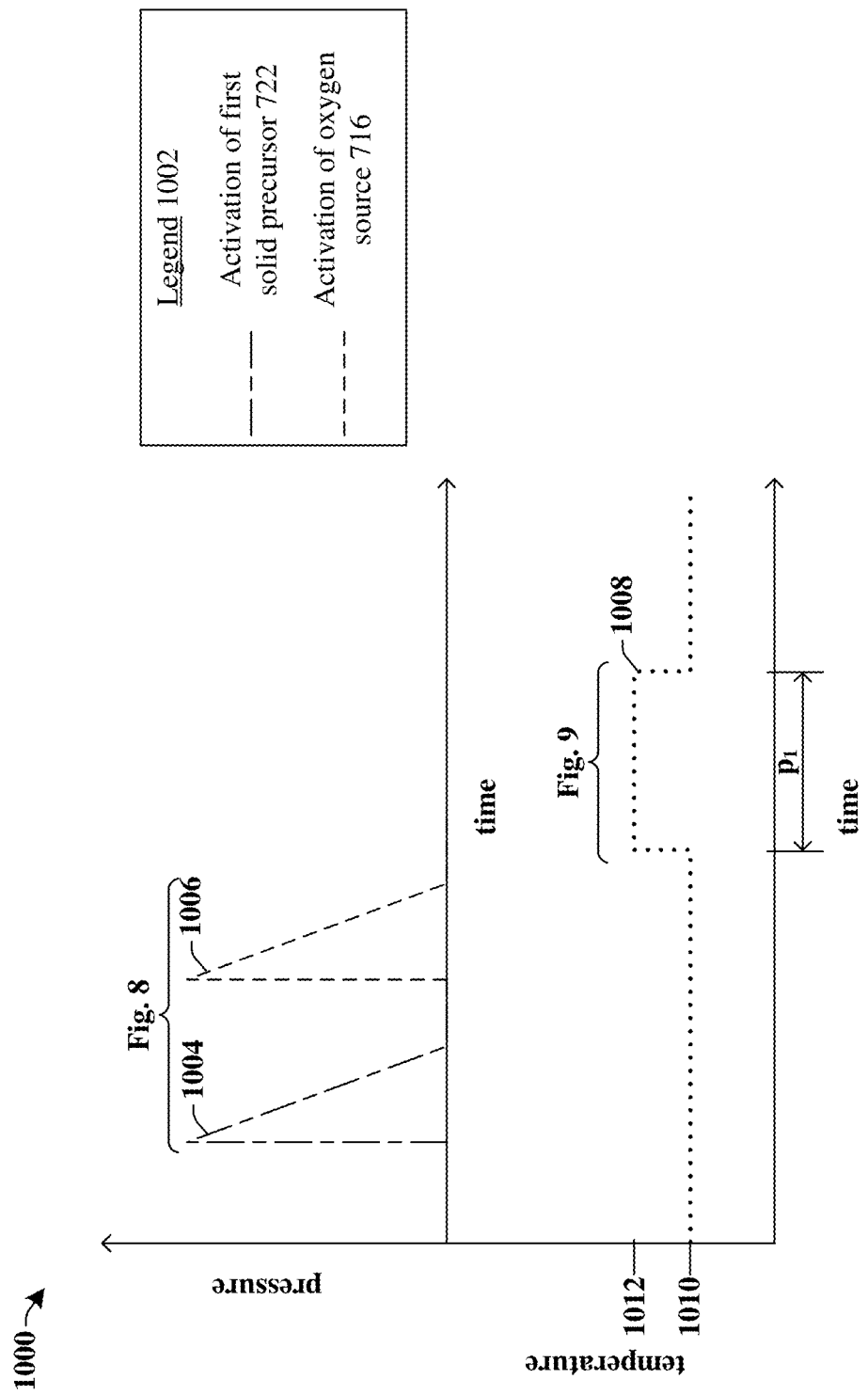

FIGS. 8-10 illustrate cross-sectional views and a timing diagram of some embodiments of a first method of forming and annealing a seed layer over a gate electrode.

As shown in cross-sectional view 800 of FIG. 8, in some embodiments, a seed layer 806 is formed over the gate electrode 106 by activating the first solid precursor 722 and the oxygen source 716. In some embodiments, the seed layer 806 comprises a metal oxide. For example, in some embodiments, the seed layer 806 comprises zirconium oxide, tantalum oxide, zirconium yttrium oxide, hafnium oxide, a combination thereof, or some other suitable metal oxide. In some such embodiments, the first solid precursor 722 comprises the metal of the metal oxide of the seed layer 806, and the oxygen source 716 provides the oxygen to react with the metal of the first solid precursor 722 to form the seed layer 806 on the gate electrode 106. For example, in some embodiments, wherein the seed layer 806 comprises zirconium oxide, the first solid precursor 722 may comprise, for example, $Zr[OC(CH_3)_3]_4$, $Zr(CH_3C_5H_4)_2CH_3OCH_3$, $Zr(N(CH_3)_2)_4$, $Zr(N(CH_3)(C_2H_5))_4$, $Hf[C_5H_4(CH_3)]_2(CH_3)_2$, HfCH$_3$(OCH$_3$)[(C$_2$H$_5$(CH$_3$)]$_2$, Hf(N(CH$_3$)$_2$)$_4$, Hf(N(CH$_3$(C$_2$H$_5$))$_4$, or some other suitable precursor comprising zirconium.

In some embodiments, to activate the first solid precursor 722, the door-like structures 734 on the first precursor vessel 710 are "opened" and all other door-like structures 734 on the other precursor vessels (e.g., 718, 732) are "closed." In some embodiments, the inert gas source 712 is then turned "ON" such that the inert gas reacts with the first solid precursor 722, and a precursor vapor enters the reaction chamber through the first gas inlet line 708 as indicated by the first arrows 802. In some embodiments, the inert gas source 712 comprises, for example, nitrogen gas, argon gas, hydrogen gas, a combination thereof, or some other suitable gas.

In some embodiments, the oxygen source 716 is turned "ON" such that an oxygen vapor enters the reaction chamber as indicated by a second arrow 804. In some embodiments, the oxygen source 716 comprises, for example, a water vapor, oxygen gas, or the like. In some such embodiments, the oxygen vapor may react with the precursor vapor within the reaction chamber such that the seed layer 806 comprising the metal oxide is formed on the gate electrode 106. In some embodiments, the seed layer 806 has a second thickness $t_2$ in a range of between, for example, approximately 0.1 nanometers and approximately 5 nanometers. In some embodiments, byproducts from the reaction between the oxygen vapor and the precursor vapor may exit the chamber out of the gas outlet line 717.

In some embodiments, the reaction chamber is set to a temperature in a range of between, for example, approximately 200 degrees Celsius and approximately 400 degrees Celsius to form the seed layer 806. In some embodiments, the temperature control circuitry 738 is what controls and regulates the temperature of the reaction chamber and/or the wafer chuck 701 during the formation of the seed layer 806.

In some embodiments, the seed layer 806 has a crystal structure comprising various phases, such as, for example, cubic phase, tetragonal phase, and/or orthorhombic phase. In some embodiments, the crystal structure of the seed layer 806 has a first value of the orthorhombic phase, wherein the first value is equal to a percent of the crystal structure of the seed layer 806 comprising the orthorhombic phase. In some embodiments, the crystal structure of a material is measured by x-ray diffraction to determine which phases are present in the material and relatively how much of each phase is present in the material. In some embodiments, the first value is less than 35 percent because the amount of a material's crystal structure that comprises the orthorhombic phase typically does not exceed 35 percent when the material is formed by an ALD process without an annealing process.

As shown in cross-sectional view 900 of FIG. 9, in some embodiments, a temperature of the seed layer (806 of FIG. 8) is increased for a certain time period to anneal the seed layer (806 of FIG. 8) to form an annealed seed layer 108. In some embodiments, the temperature of the seed layer (806 of FIG. 8) is increased using the temperature control circuitry 738. In some embodiments, the temperature control circuitry 738 is coupled to a heating element in the wafer chuck 701 such that the wafer chuck 701 is increased in temperature, as well as the substrate 102, the dielectric layer 104, the gate electrode 106, and the seed layer (806 of FIG. 8). In some other embodiments, the temperature control circuitry 738 is coupled to a heating element arranged elsewhere in the reaction chamber to increase the temperature of the chamber and thus, the seed layer (806 of FIG. 8). In some such embodiments, the annealing process is performed in-situ (i.e., in the same chamber as) with the formation of the seed layer (806 of FIG. 8). In some other embodiments, the annealing process is performed in a separate furnace, such as, for example, a rapid thermal annealing furnace. In some such other embodiments, the substrate 102 is removed from the reaction chamber of FIG. 9 and inserted into the furnace to anneal the seed layer (806 of FIG. 8) and form the annealed seed layer 108.

In some embodiments, to form the annealed seed layer 108, the annealing temperature is in a range of between, for example, approximately 350 degrees Celsius and approximately 750 degrees Celsius. In some embodiments, the annealing temperature is held for a time period in a range of between, for example, approximately 30 seconds and approximately 5 minutes. In some embodiments, the annealing temperature causes the crystal structure of the seed layer (806 of FIG. 8) to change. In some embodiments, the annealing temperature increases the percent of the crystal structure of the annealed seed layer 108 that comprises the orthorhombic phase. Thus, in some embodiments, the crystal structure of the annealed seed layer 108 has a second value of the orthorhombic phase, wherein the second value is equal to a percent of the crystal structure of the annealed seed layer 108 comprising the orthorhombic phase. Because of the annealing process, the second value of the annealed seed layer 108 is greater than the first value of the seed layer (806 of FIG. 8) before the annealing process. In some embodiments, the second value is greater than 35 percent because of the annealing process increases the orthorhombic phase amount in the annealed seed layer 108 compared to the seed layer (806 of FIG. 8).

In some embodiments, the first thickness $t_1$ of the gate electrode 106 and the second thickness $t_2$ of the seed layer (806 of FIG. 8) does not change during the annealing process. Thus, in some embodiments, the annealed seed layer 108 has a thickness equal to the second thickness $t_2$.

FIG. 10 illustrates a timing diagram 1000 of the first method of forming the annealed seed layer (108 of FIG. 9) over the gate electrode (106 of FIG. 9). The timing diagram 1000 illustrates the pressure of various gas sources versus time and temperature versus time for the steps illustrated in FIGS. 8 and 9 to form the annealed seed layer (108 of FIG. 9).

A legend 1002 indicates that a first peak 1004 in the pressure versus time portion of the timing diagram 1000 corresponds to the activation of the first solid precursor (722 of FIG. 8) illustrated in FIG. 8. As indicated by the y-axis, the first solid precursor (722 of FIG. 8) is activated/turned "ON" by increasing the pressure of the inert gas source (712 of FIG. 8). Similarly, after the activation of the first solid precursor (722 of FIG. 8), in some embodiments, the oxygen source (716 of FIG. 8) is activated in FIG. 8, as indicated by the legend 1002 and a second peak 1006 on the pressure versus time portion of the timing diagram 1000. As indicated by the y-axis, the oxygen source (716 of FIG. 8) is activated/turned "ON" by increasing the pressure of the oxygen source (716 of FIG. 8). In some embodiments, the first peak 1004 does not overlap with the second peak 1006. In some other embodiments, the first peak 1004 may partially or completely overlap with the second peak 1006.

In some embodiments, the reaction chamber is set to a first temperature 1010 in a range of about, for example, approximately 200 degrees Celsius and approximately 400 degrees Celsius during the first and second peaks 1004, 1006 that activate the first solid precursor (722 of FIG. 8) and the oxygen source (716 of FIG. 8). In some embodiments, after the first and second peaks 1004, 1006, the temperature of the reaction chamber and/or the seed layer (806 of FIG. 9) is increased to an annealed temperature 1012 as illustrated by a third peak 1008 to perform the annealing process of FIG. 9. In some embodiments, the annealing process of FIG. 9 is performed for a first time period p 1 in a range of between, for example, approximately 30 seconds and approximately 5 minutes. After the first time period pi, the temperature may be reduced back to the first temperature 1010.

It will be appreciated that in some embodiments, to increase a thickness of the seed layer (806 of FIG. 8), the steps of forming the seed layer (806 of FIG. 8) represented by the first and second peaks 1004, 1006 may be repeated. In some embodiments, the annealing process indicated by the third peak 1008 may be performed once after the formation steps of the first and second peaks 1004, 1006 are repeated, or in some other embodiments, the annealing process may be performed after each sequence of the first and second peaks 1004, 1006.

Figure 11:
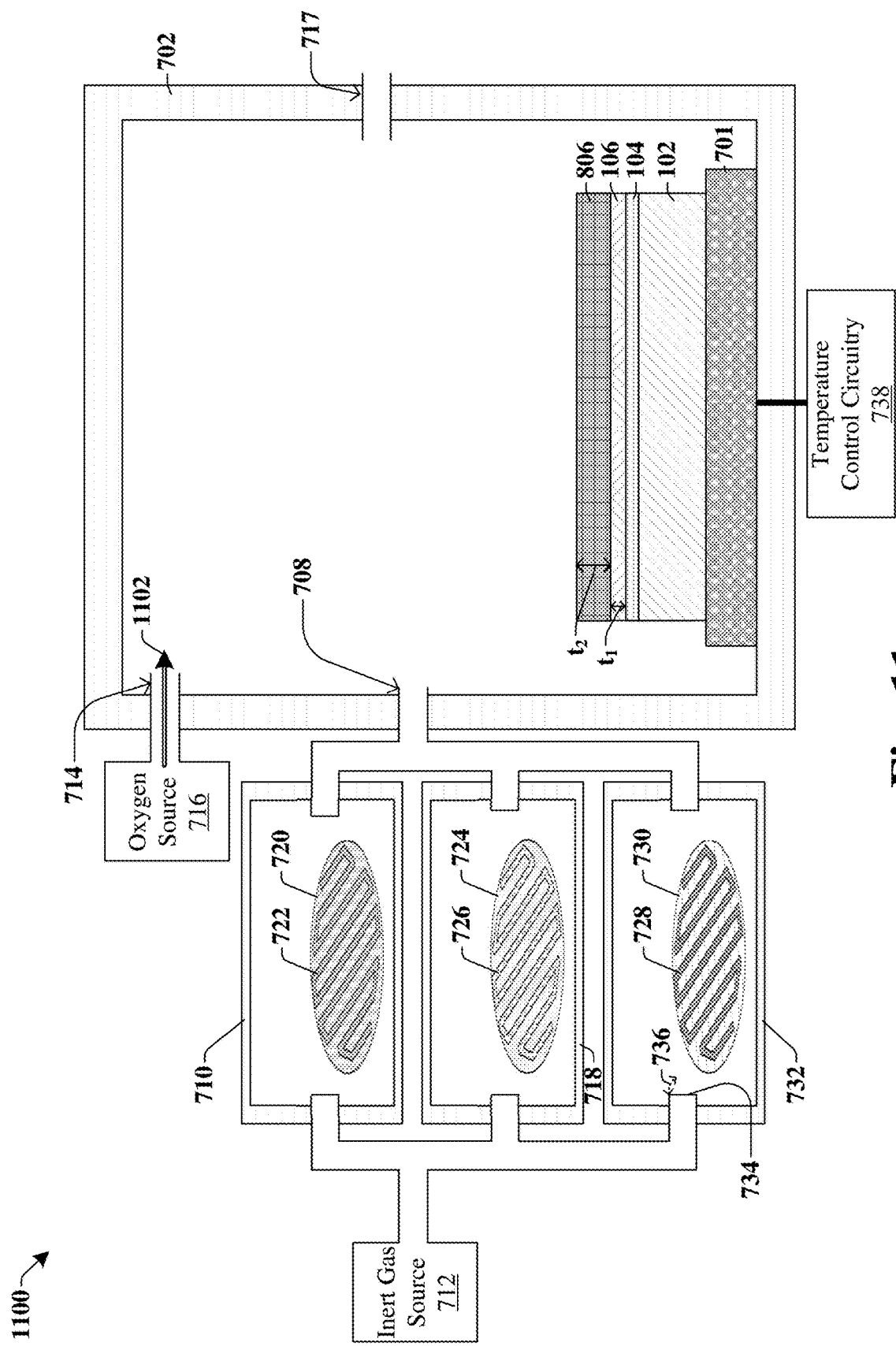
Figure 12:
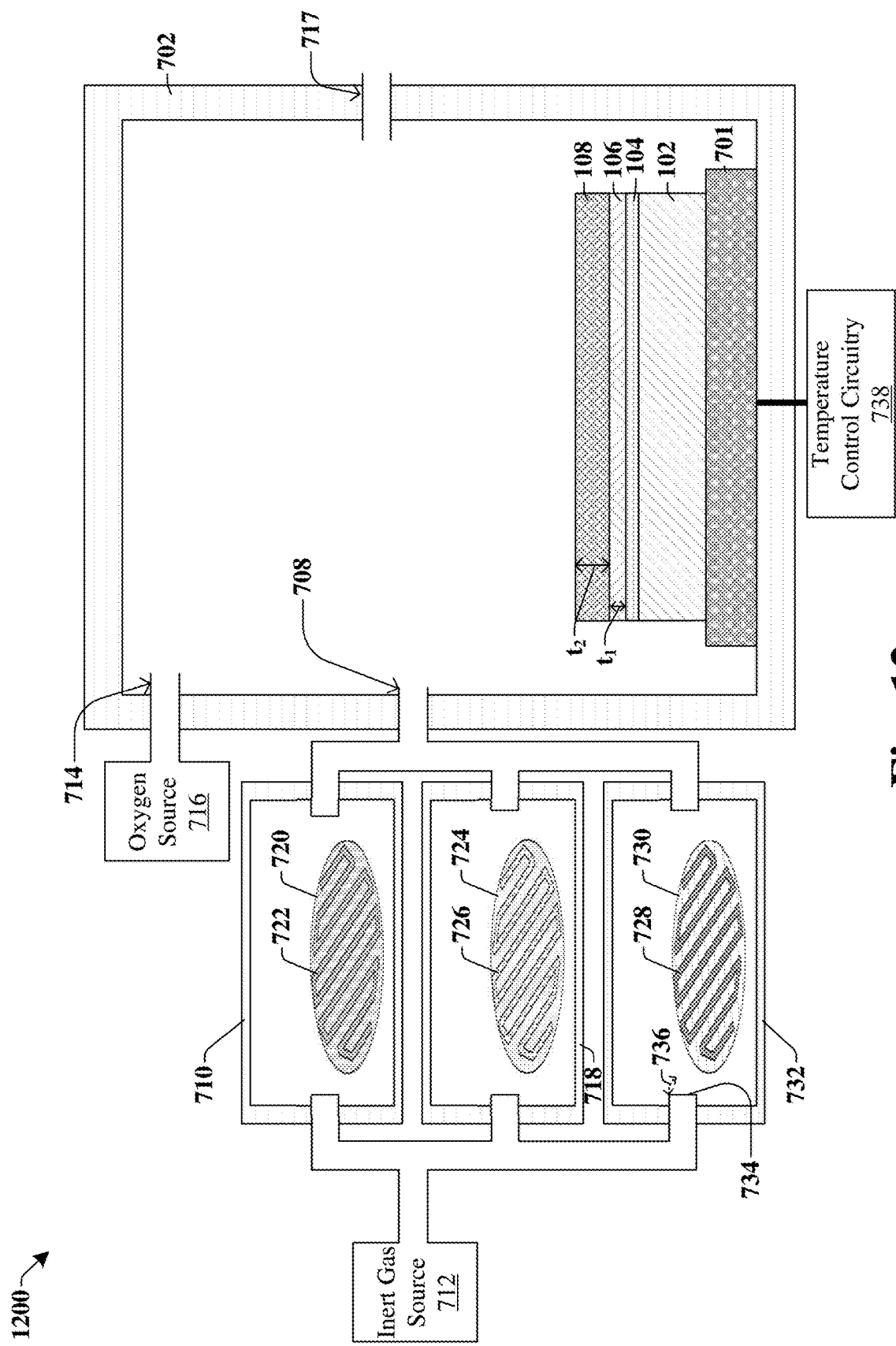
Figure 13:
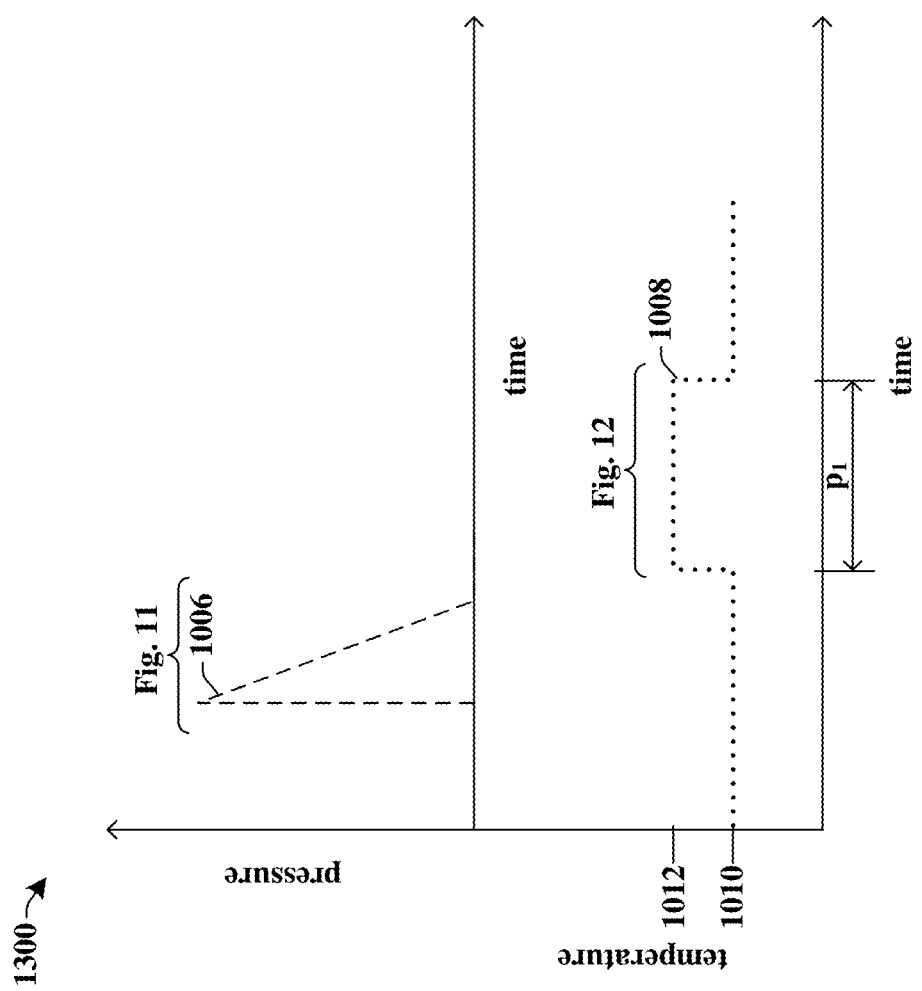

FIGS. 11-13 illustrate cross-sectional views and a timing diagram of some embodiments of a second method of forming and annealing a seed layer over a gate electrode. Thus, in some embodiments, the method proceeds from FIG. 7 to FIG. 11, thereby skipping the steps in FIGS. 8-10.

As shown in cross-sectional view 1100 of FIG. 11, in some embodiments, the oxygen source 716 is activated and an oxygen vapor enters the reaction chamber as illustrated by arrow 1102. In some such embodiments, the oxygen vapor oxidizes an upper portion of the gate electrode 106 to form the seed layer 806 over the gate electrode 106. In some such embodiments, the seed layer 806 comprises a metal of the gate electrode 106 and oxygen. Thus, in some embodiments, a metal source from the solid precursors (e.g., 722, 726, 728) is not needed to form the seed layer 806, and thus, the inert gas source 712 is "OFF" in FIG. 11. In some embodiments, the first thickness $t_1$ of the gate electrode 106 is decreased from FIG. 7 to FIG. 11 because an upper portion of the gate electrode 106 is oxidized into the seed layer 806.

As shown in cross-sectional view 1200 of FIG. 12, in some embodiments, the annealing process is performed by the temperature control circuitry 738 or an external furnace chamber to anneal the seed layer (806 of FIG. 11) and form the annealed seed layer 108 with an increased amount of orthorhombic phases.

FIG. 13 illustrates a timing diagram 1300 of the second method of forming the annealed seed layer (108 of FIG. 12) over the gate electrode (106 of FIG. 12). The timing diagram 1300 illustrates the pressure of various gas sources versus time and temperature versus time for the steps illustrated in FIGS. 11 and 12 to form the annealed seed layer (108 of FIG. 9). Compared to the first method illustrated in timing diagram 1000 of FIG. 10, the activation of the first solid precursor (722 of FIG. 8) is omitted in the second method illustrated in timing diagram 1300 of FIG. 13 in some embodiments.

It will be appreciated that in yet some other embodiments, the annealed seed layer (108 of FIG. 12) may comprise a combination and/or variation of the first and second methods. For example, in some embodiments, the annealed seed layer (108 of FIG. 12) may comprise a first metal oxide layer formed using the second method illustrated in timing diagram 1300 of FIG. 13 by oxidizing an upper portion of the gate electrode (106 of FIG. 12). Further, for example, in some embodiments, the annealed seed layer (108 of FIG. 12) may comprise a second metal oxide layer over the first metal oxide layer formed using the first method illustrated in timing diagram 1000 of FIG. 10 by activating a first solid precursor (722 of FIG. 8).

Figure 14A:
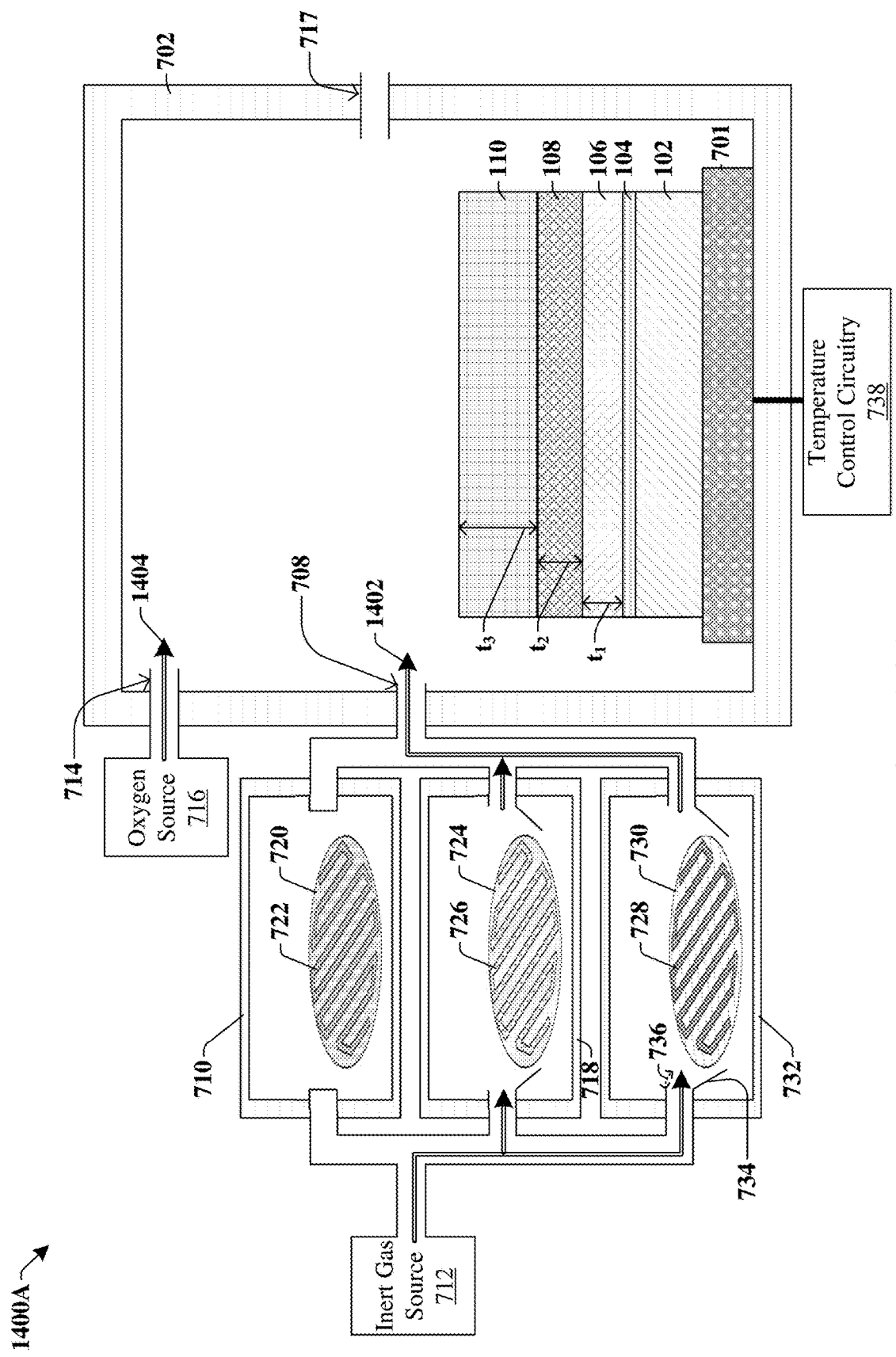
Figure 14C:
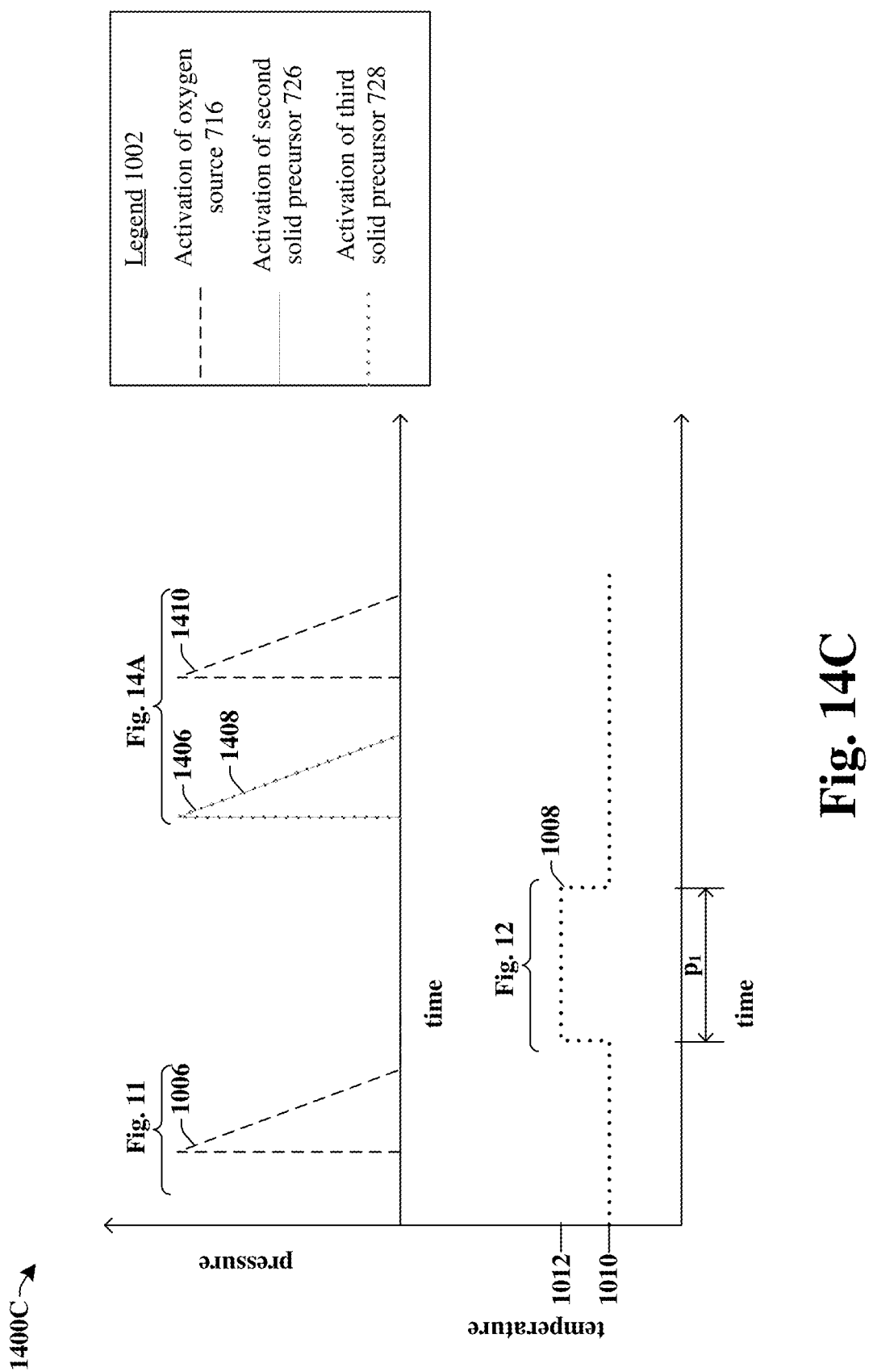

FIGS. 14A-C illustrate a first method of forming a memory layer 110 over the annealed seed layer 108, wherein the memory layer 110 comprises a mixture of memory materials.

As shown in cross-sectional view 1400A of FIG. 14A, in some embodiments, the memory layer 110 is formed over the annealed seed layer 108 in-situ (i.e., in a same chamber) with the annealed seed layer 108. In some embodiments, the memory layer 110 is formed by activating the second solid precursor 726, the third solid precursor 728, and the oxygen source 716. For example, in some embodiments, the door-like structures 734 are closed on the first precursor vessel 710, but open on the second and third precursor vessels 718, 732 such that the second and third solid precursors 726, 728 may be accessed. In some embodiments, the inert gas source 712 is turned "ON" such that a precursor vapor enters the reaction chamber as indicated by arrows 1402. In some embodiments, the oxygen source 716 is turned "ON" such that an oxygen vapor enters the reaction chamber as indicated by arrow 1404. In some embodiments, the oxygen vapor reacts with the precursor vapor within the reaction chamber to form a memory layer 110 over the annealed seed layer 108. In some embodiments, byproducts of the reaction exit the reaction chamber through the gas outlet line 717.

In some embodiments, the memory layer 110 may comprise a ferroelectric material capable of data storage. In some embodiments, the memory layer 110 comprises a mixture of two materials, wherein the second solid precursor 726 corresponds to the first material, and wherein the third solid precursor 728 corresponds to the second material. For example, in some embodiments, the memory layer 110 comprises strontium bismuth tantalite, lead zirconate titanate, hafnium zinc oxide, hafnium zirconium oxide, doped hafnium oxide, or some other suitable ferroelectric material. In some embodiments, wherein the memory layer 110 comprises hafnium zirconium oxide, for example, the second solid precursor 726 may correspond to a source for hafnium, and the third solid precursor 728 may correspond to a source for zirconium. Upon activation of the second and third solid precursors 726, 728, the hafnium and zirconium may react with the oxygen source 716 in the reaction chamber to form the memory layer 110 on the annealed seed layer 108 comprising a mixture of hafnium oxide and zirconium oxide, in some embodiments.

It will be appreciated that a same metal may be in the annealed seed layer 108 and the memory layer 110. For example, in some embodiments, the annealed seed layer 108 may comprise zirconium oxide, and the memory layer 110 comprises zirconium hafnium oxide. In some such embodiments, a same solid precursor (e.g., 722, 726, or 728) corresponding to zirconium may be activated in forming the annealed seed layer 108 and in forming the memory layer 110.

Nevertheless, in some embodiments, because the annealed seed layer 108 has a higher instance of orthorhombic phases than the seed layer (806 of FIG. 8), the memory layer 110 that is formed over the annealed seed layer 108 also has a higher instance of orthorhombic phases than if it were formed on the seed layer (806 of FIG. 8). With a higher instance of orthorhombic phases, the memory layer 110 may have more reliable ferroelectric properties (i.e., the ability to switch between polarization states upon the presence of an electric field). In some embodiments, for example, the crystal structure of the memory layer 110 also has the second value of the orthorhombic phase, wherein the second value is equal to a percent of the crystal structure of the memory layer 110 comprising the orthorhombic phase. In some other embodiments, the crystal structure of the memory layer 110 may have a third value of the orthorhombic phase that is less than or greater than the second value.

Further, in some embodiments, the second solid precursor 726, the third solid precursor 728, and the oxygen source 716 are activated many times to increase a thickness of the memory layer 110. In some embodiments, the memory layer 110 has a third thickness $t_3$ in a range of between, for example, approximately 9 nanometers and approximately 12 nanometers.

FIG. 14B illustrates a timing diagram 1400B of some embodiments, wherein the first method of forming the memory layer 110 is performed after the first method of forming the annealed seed layer 108. In other words, in some embodiments, the method proceeds from FIG. 10 to FIG. 14A, thereby skipping the steps of FIGS. 11-13.

In some embodiments, the activation of the second solid precursor (726 of FIG. 14A) corresponds to a fourth peak 1406 and the activation of the third solid precursor (728 of FIG. 14A) corresponds to a fifth peak 1408. In some embodiments, the fourth and fifth peaks 1406, 1408 completely overlap because the second and third solid precursors (726, 728 of FIG. 14A) are activated at a same time. In some embodiments, after the activation of the second and third solid precursors (726, 728 of FIG. 14A), the oxygen source (716 of FIG. 14A) is again activated according to the sixth peak 1410. Further, in some embodiments, the steps of FIG. 14A are formed after the third peak 1008 indicating the annealing process of FIG. 9, and are formed at the first temperature 1010. Thus, in some embodiments, the timing diagram 1400B of FIG. 14B illustrates the steps performed in FIG. 14A to form the memory layer (110 of FIG. 14A) after forming the annealed seed layer (108 of FIG. 9) in FIGS. 8 and 9.

FIG. 14C illustrates a timing diagram 1400C of some embodiments, wherein the first method of forming the memory layer 110 is performed after the second method of forming the annealed seed layer 108. In other words, in some embodiments, the method proceeds from FIG. 13 to FIG. 14A, thereby skipping the steps of FIGS. 8-10.

Thus, in some embodiments, the timing diagram 1400C of FIG. 14C illustrates the steps performed in FIG. 14A to form the memory layer (110 of FIG. 14A) after forming the annealed seed layer (108 of FIG. 12) in FIGS. 11 and 12.

Figure 15A:
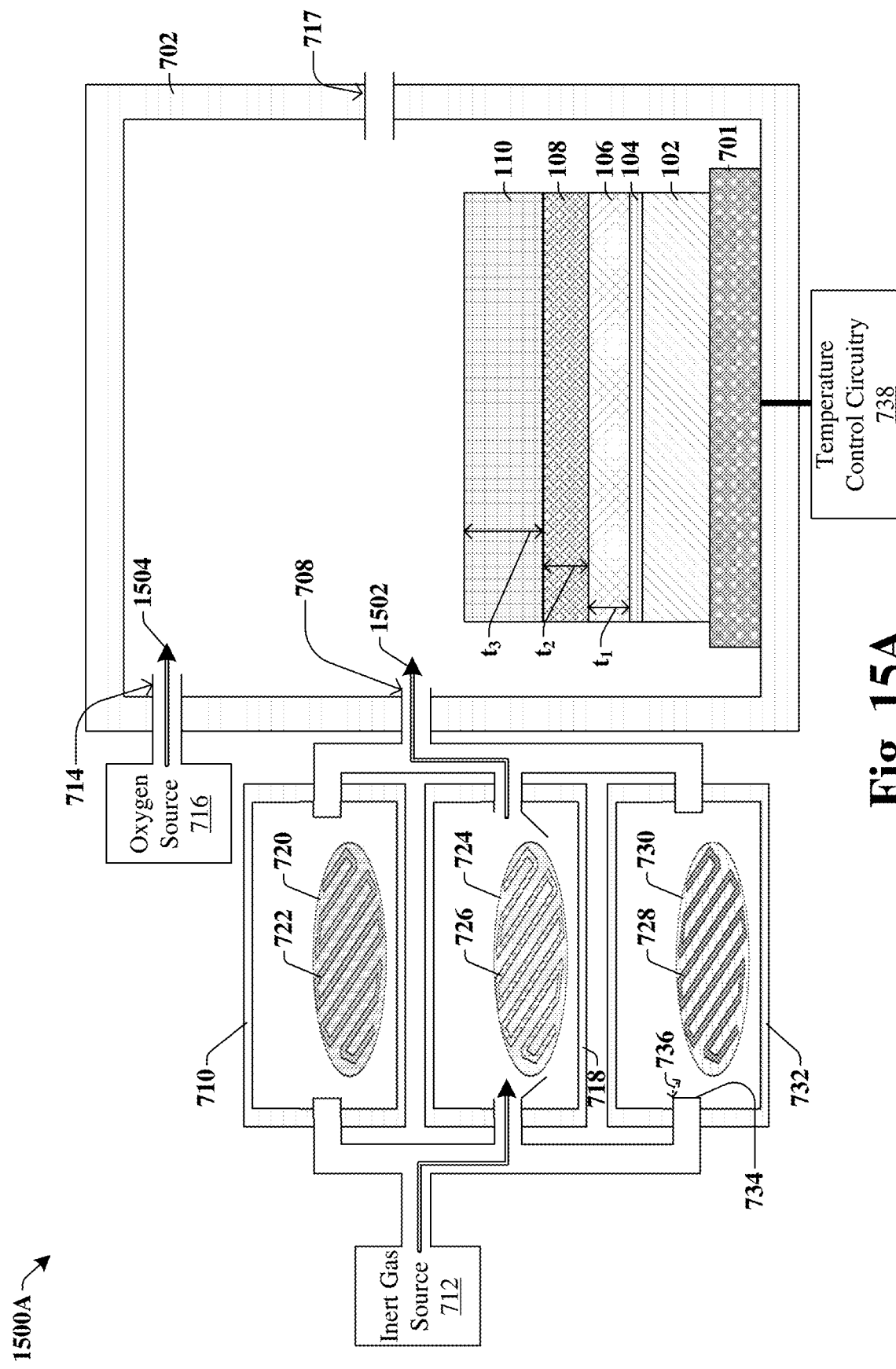
Figure 15C:
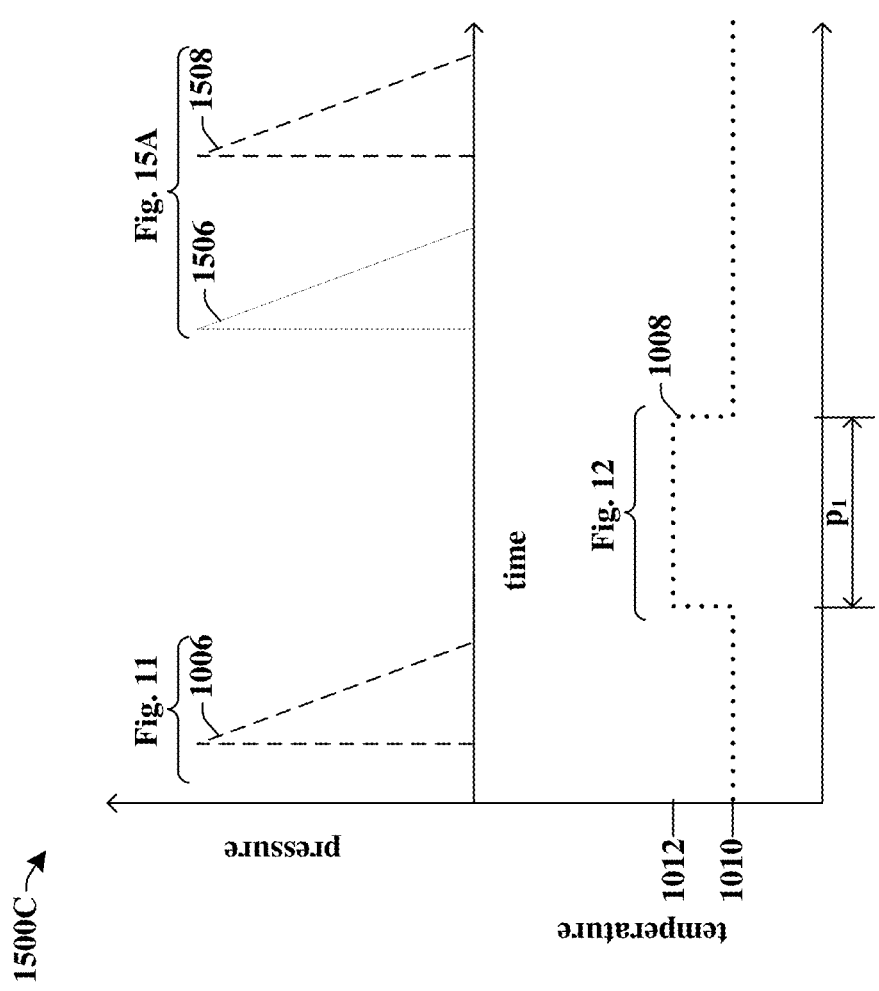

FIGS. 15A-C illustrate a second method of forming a memory layer 110 over the annealed seed layer 108, wherein the memory layer 110 comprises a mixture of memory materials.

As shown in cross-sectional view 1500A of FIG. 15A, in some embodiments, the memory layer 110 is formed by activating the second solid precursor 726 as indicated by arrow 1502 and the oxygen source 716 as indicated by arrow 1504. In some such embodiments, the second solid precursor 726 may comprise a mixture of multiple solid precursors such that only one precursor vessel (e.g., 718) is accessed to form the memory layer 110 comprising a mixture of multiple materials. In other words, in some embodiments, the second solid precursor 726 in FIG. 15A may comprise a mixture of a solid precursor corresponding to a first material of the memory layer 110 and a solid precursor corresponding to a second material of the memory layer 110.

FIG. 15B illustrates a timing diagram 1500B of some embodiments, wherein the second method of forming the memory layer 110 is performed after the first method of forming the annealed seed layer 108. In other words, in some embodiments, the method proceeds from FIG. 10 to FIG. 15A, thereby skipping the steps of FIGS. 11-14C.

In some embodiments, the activation of the second solid precursor (726 of FIG. 15A) corresponds to a seventh peak 1506 that occurs after the third peak 1008 corresponding to the annealing process of FIG. 9. In some embodiments, the activation of the oxygen source (716 of FIG. 15A) corresponds to an eighth peak 1508, occurs after or during the seventh peak 1506, and is used to react with the second solid precursor (726 of FIG. 15A) to form the memory layer 110. Thus, in some embodiments, the timing diagram 1500B of FIG. 15B illustrates the steps performed in FIG. 15A to form the memory layer (110 of FIG. 15A) after forming the annealed seed layer (108 of FIG. 9) in FIGS. 8 and 9.

FIG. 15C illustrates a timing diagram 1500C of some embodiments, wherein the second method of forming the memory layer 110 is performed after the second method of forming the annealed seed layer 108. In other words, in some embodiments, the method proceeds from FIG. 13 to FIG. 15A, thereby skipping the steps of FIGS. 8-10 and 14A-C.

Thus, in some embodiments, the timing diagram 1500C of FIG. 15C illustrates the steps performed in FIG. 15A to form the memory layer (110 of FIG. 15A) after forming the annealed seed layer (108 of FIG. 12) in FIGS. 11 and 12.

FIGS. 16A-D illustrate a third method of forming a memory layer 110 over the annealed seed layer 108, wherein the memory layer 110 comprises a multiple layers of memory materials.

Figure 16A:
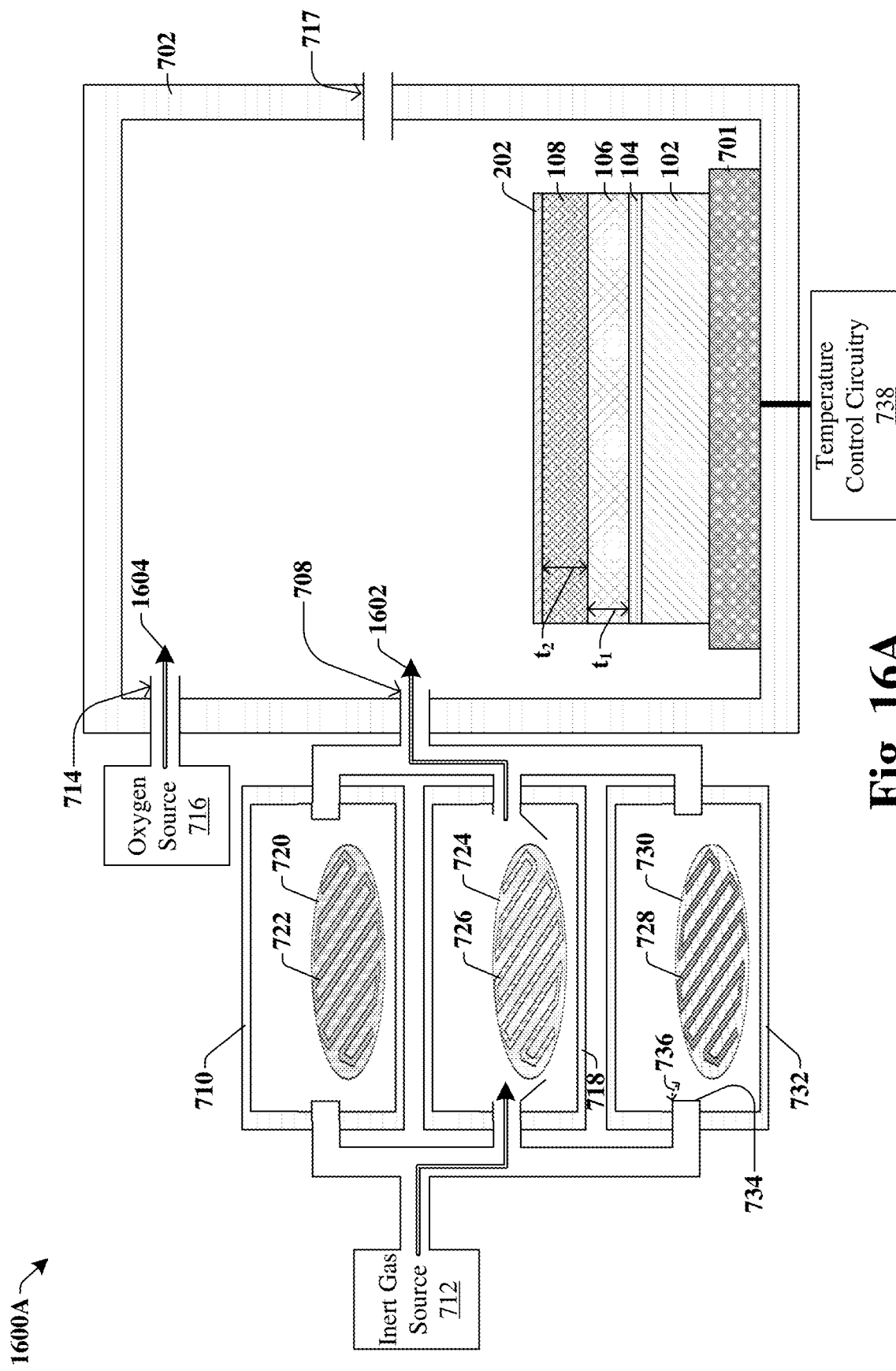

As shown in cross-sectional view 1600A of FIG. 16A, a first memory material layer 202 is formed over the annealed seed layer 108 by activating the second solid precursor 726 as indicated by arrow 1602 and by activating oxygen source 716 as indicated by arrow 1604. To access the second solid precursor 726 in the second precursor vessel 718 and not the first or third precursor vessels 710, 732, the door-like structures 734 on the second precursor vessel 718 are "open," while the door-like structures 734 on the first and third precursor vessels 710, 732 are "closed."

In some such embodiments, the first memory material layer 202 may comprise a first metal oxide. For example, in some embodiments, the first memory material layer 202 may comprise, for example, zirconium oxide, zinc oxide, yttrium oxide, hafnium oxide, or some other suitable metal oxide. In some such embodiments, the second solid precursor 726 may comprise the metal of the first metal oxide, such as, for example, zirconium, zinc, yttrium, hafnium, or the like. In some such embodiments, a precursor vapor enters the reaction chamber upon activation of the second solid precursor 726, the precursor vapor reacts with an oxygen vapor in the reaction chamber from the oxygen source 716, and the first memory material layer 202 comprising a first metal oxide is formed on the annealed seed layer 108. Because the annealed seed layer 108 comprises more orthorhombic phases, the first memory material layer 202 arranged on the annealed seed layer 108 will also have a higher instance of orthorhombic phases to improve the ferroelectric properties of the overall memory layer (110 of FIG. 16B) to be formed over the annealed seed layer 108.

Figure 16B:
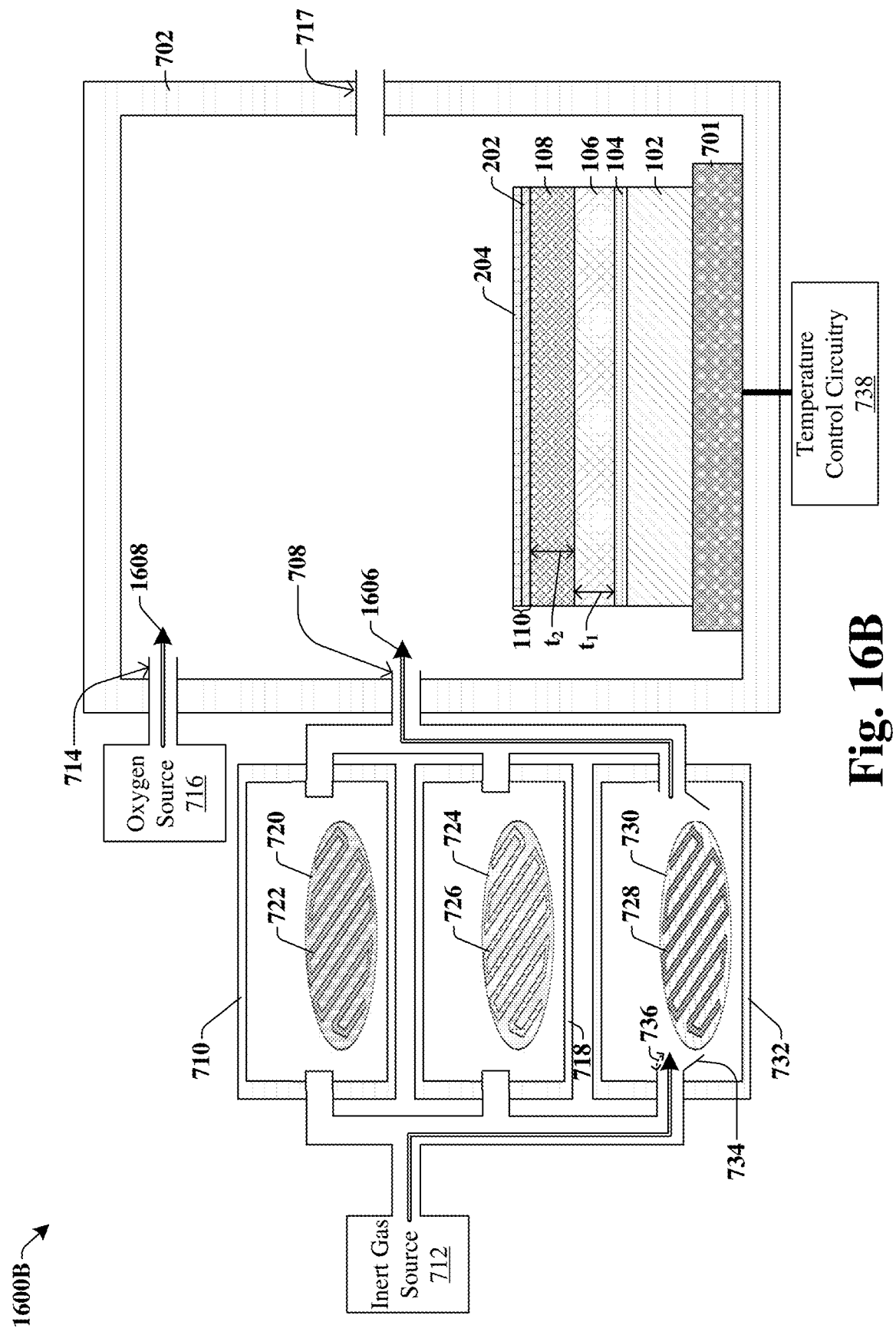

As shown in cross-sectional view 1600B of FIG. 16B, a second memory material layer 204 is formed over the first memory material layer 202 by activating the third solid precursor 728 as indicated by arrow 1606 and by activating oxygen source 716 as indicated by arrow 1608. To access the third solid precursor 728 in the third precursor vessel 732 and not the first or second precursor vessels 710, 718, the door-like structures 734 on the third precursor vessel 732 are "open," while the door-like structures 734 on the first and second precursor vessels 710, 718 are "closed."

In some such embodiments, the second memory material layer 204 may comprise a second metal oxide that is different than the first metal oxide of the first memory material layer 202. In some embodiments, the third solid precursor 728 comprises the metal of the second metal oxide of the second memory material layer 204 such as, for example, zinc, zirconium, hafnium, yttrium, or some other suitable material. In some such embodiments, a precursor vapor enters the reaction chamber upon activation of the third solid precursor 728, the precursor vapor reacts with an oxygen vapor in the reaction chamber from the oxygen source 716, and the second memory material layer 204 comprising a second metal oxide is formed on the first memory material layer 202. Because the first memory material layer 202 comprises more orthorhombic phases, the second memory material layer 204 arranged on the first memory material layer 202 will also have a higher instance of orthorhombic phases to improve the ferroelectric properties of the overall memory layer 110.

In some embodiments, the memory layer 110 comprises the first and second memory material layers 202, 204. In some embodiments, the steps in FIGS. 16A and 16B are repeated such that the memory layer 110 is thicker and comprises multiple ones of the first and second memory material layers 202, 204.

FIG. 16C illustrates a timing diagram 1600C of some embodiments, wherein the third method of forming the memory layer 110 is performed after the first method of forming the annealed seed layer 108. In other words, in some embodiments, the method proceeds from FIG. 10 to FIG. 16A, thereby skipping the steps of FIGS. 11-15C.

In some embodiments, the activation of the second solid precursor (726 of FIG. 16A) corresponds to a ninth peak 1610 that occurs after the third peak 1008 corresponding to the annealing process of FIG. 9. In some embodiments, the activation of the oxygen source (716 of FIG. 16A) corresponds to a tenth peak 1612, occurs after or during the ninth peak 1610, and is used to react with the second solid precursor (726 of FIG. 16A) to form the first memory material layer (202 of FIG. 16A). Thus, in some embodiments, ninth and tenth peaks 1610, 1612 correspond to the steps performed in FIG. 16A to form the first memory material layer (202 of FIG. 16A) after forming the annealed seed layer (108 of FIG. 9) in FIGS. 8 and 9.

In some embodiments, the activation of the third solid precursor (728 of FIG. 16B) corresponds to an eleventh peak 1614 that occurs after the tenth peak 1612. In some embodiments, the activation of the oxygen source (716 of FIG. 16A) corresponds to a twelfth peak 1616, occurs after or during the eleventh peak 1614, and is used to react with the third solid precursor (728 of FIG. 16B) to form the second memory material layer (204 of FIG. 16B) over the first memory material layer (202 of FIG. 16B). Thus, in some embodiments, the eleventh and twelfth peaks 1614, 1616 correspond to the steps performed in FIG. 16B to form the second memory material layer (204 of FIG. 16B) after the steps in FIG. 16A.

Figure 16D:
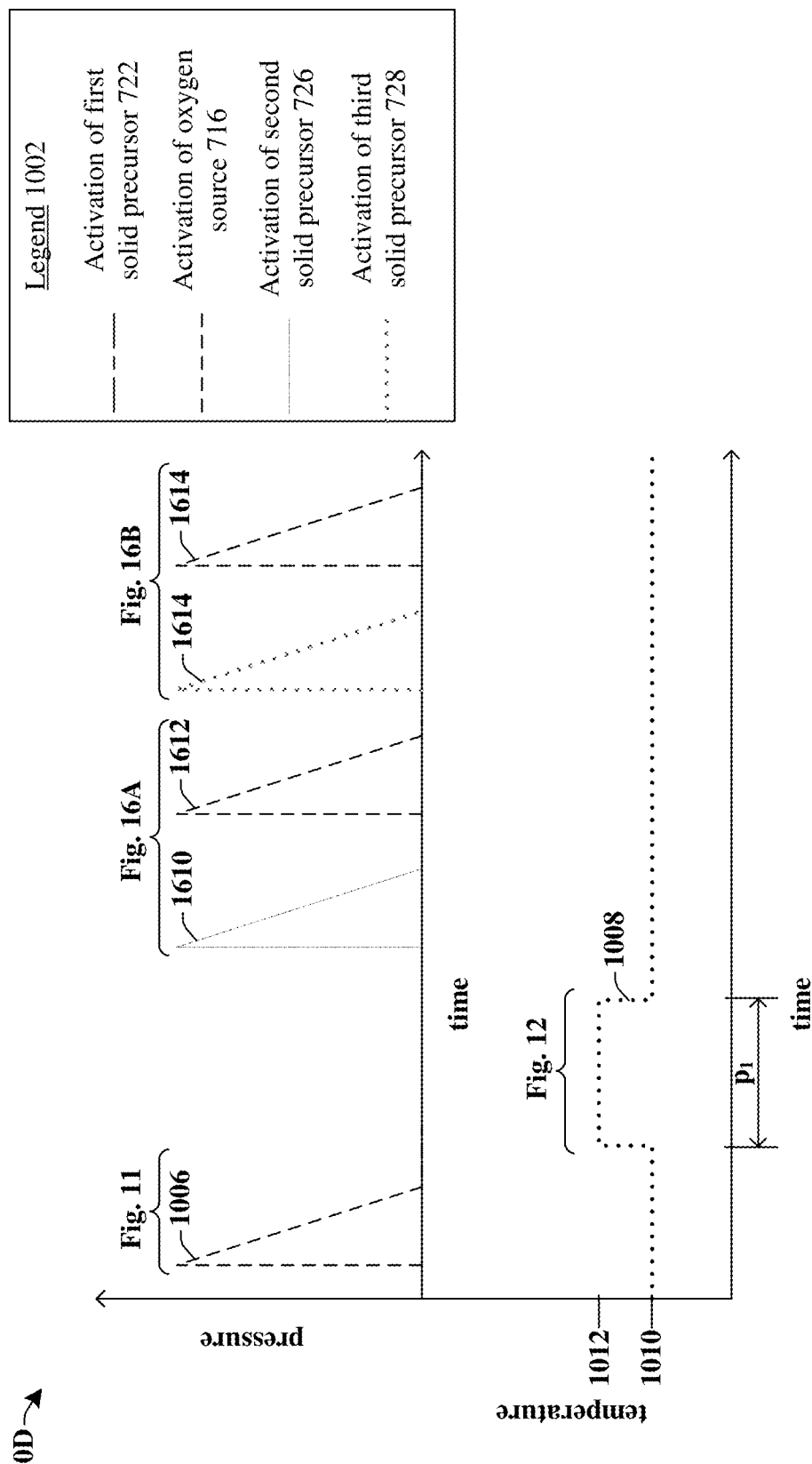

FIG. 16D illustrates a timing diagram 1600D of some embodiments, wherein the third method of forming the memory layer 110 is performed after the second method of forming the annealed seed layer 108. In other words, in some embodiments, the method proceeds from FIG. 13 to FIG. 16A, thereby skipping the steps of FIGS. 8-10 and 14A-15C.

Thus, in some embodiments, the timing diagram 1600D of FIG. 16D illustrates the steps performed in FIG. 16A to form the first memory material layer (202 of FIG. 16A) and the steps performed in FIG. 16B to form the second memory material layer (204 of FIG. 16B) after forming the annealed seed layer (108 of FIG. 12) in FIGS. 11 and 12.

Figure 17:
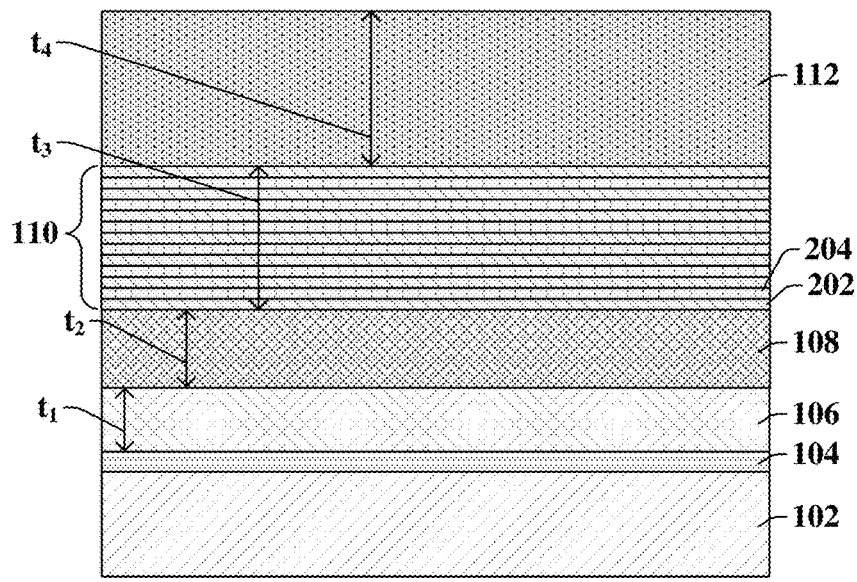

As shown in cross-sectional view 1700 of FIG. 17, in some embodiments, after forming the memory layer 110 over the annealed seed layer 108, an active layer 112 is formed over the memory layer 110. It will be appreciated that the method may proceed from FIG. 14A to FIG. 17, from FIG. 15A to FIG. 17, or from FIG. 16B to FIG. 17.

The cross-sectional view 1700 of FIG. 17 proceeds from FIG. 16B to FIG. 17. In some embodiments, multiple more first and second memory material layers 202, 204 are formed to increase a thickness of the memory layer 110 by repeating the steps of FIGS. 16A and 16B.

In some embodiments, the active layer 112 is formed over the memory layer 110 by way of a deposition process (e.g., PVD, CVD, ALD, etc.). In some embodiments, the active layer 112 may be formed using a similar ALD process as used in the methods of forming the memory layer 110 in FIGS. 14A, 15A, and FIGS. 16A and 16B. For example, in some embodiments, the active layer 112 may comprise a semiconductor material such as indium gallium zinc oxide. In some such embodiments, the active layer 112 may comprise a mixture of indium oxide, gallium oxide, and zinc oxide or may comprise multiple layers, wherein each layer comprises indium oxide, gallium oxide, or zinc oxide. In some other embodiments, the active layer 112 may comprise other combinations of metal oxides including, for example, gallium, hafnium, zirconium, titanium, aluminum, tantalum, strontium, barium, scandium, magnesium, lanthanum, gadolinium, or some other suitable metal. In yet some other embodiments, the active layer 112 may comprise some other suitable semiconductor material such as, for example, silicon, germanium, or the like. In some embodiments, the active layer 112 is formed to have a fourth thickness $t_4$ in a range of between, for example, approximately 10 nanometers and approximately 12 nanometers.

Figure 18:
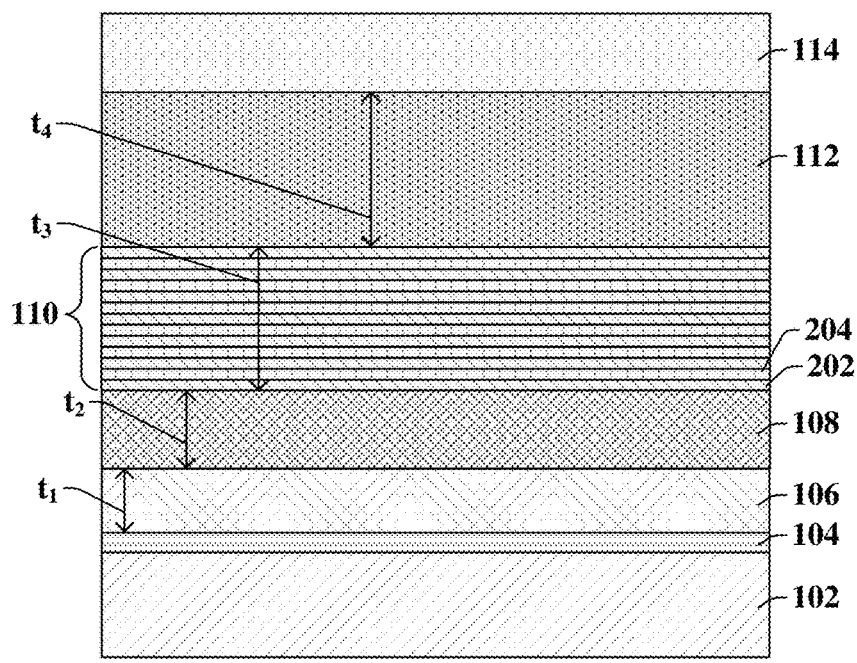

As shown in cross-sectional view 1800 of FIG. 18, an interconnect dielectric layer 114 is formed over the active layer 112. In some embodiments, the interconnect dielectric layer 114 comprises, for example, a nitride (e.g., silicon nitride, silicon oxynitride), a carbide (e.g., silicon carbide), an oxide (e.g., silicon oxide), borosilicate glass (BSG), phosphoric silicate glass (PSG), borophosphosilicate glass (BPSG), a low-k oxide (e.g., a carbon doped oxide, SiCOH), or the like. In some embodiments, the etch stop layers 306 may comprise, for example, silicon carbide, silicon nitride, or some other suitable dielectric material. In some embodiments, the interconnect dielectric layer 114 is formed by way of a deposition process (e.g., PVD, CVD, ALD, etc.).

Figure 19:
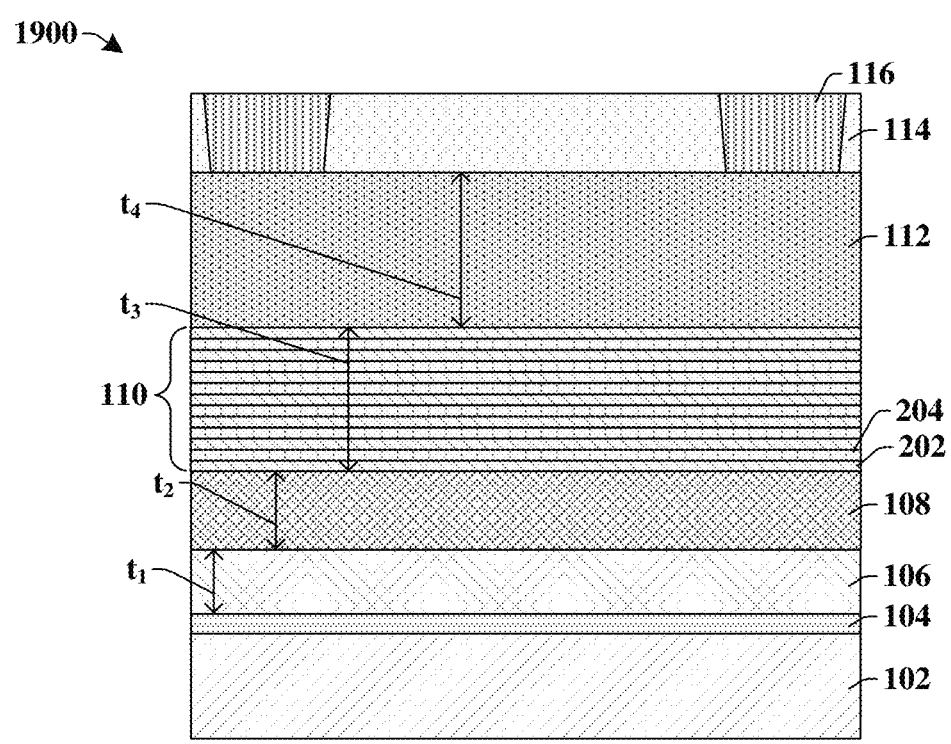

As shown in cross-sectional view 1900 of FIG. 19, in some embodiments, source/drain contacts 116 are formed within the interconnect dielectric layer 114. In some embodiments, the source/drain contacts 116 extend through the interconnect dielectric layer 114 to contact the active layer 112. In some embodiments, the source/drain contacts 116 comprise, for example, aluminum, tungsten, copper, tantalum, titanium, or some other suitable conductive material. In some embodiments, the source/drain contacts 116 are formed within the interconnect dielectric layer 114 through various steps comprising deposition processes (e.g., PVD, CVD, ALD, sputtering, spin-on, etc.), removal processes (e.g., wet etching, dry etching, chemical mechanical planarization, etc.), and/or patterning processes (e.g., photolithography, etching).

In some embodiments, the resulting structure in FIG. 19 is a thin film transistor (TFT) that is also a field effect transistor (FET) ferroelectric random access memory (Fe- RAM) device. In some such embodiments, when sufficient signals (e.g., current, voltage) are applied to the source/drain contacts 116 and the gate electrode 106, a channel region may form in the active layer 112 such that data states can be read from or written to the memory layer 110. Data states are written to the memory layer 110 based on a process of reversible switching between polarizations states in the memory layer 110 because the ferroelectric material's crystal structure changes when an electric field is present. Because the memory layer 110 is formed on the annealed seed layer 108, the crystal structure of the memory layer 110 has a higher instance of orthorhombic phases, which improves the ferroelectric properties of the memory layer 110 and overall reliability and performance of the FET FeRAM device.

Figure 20:
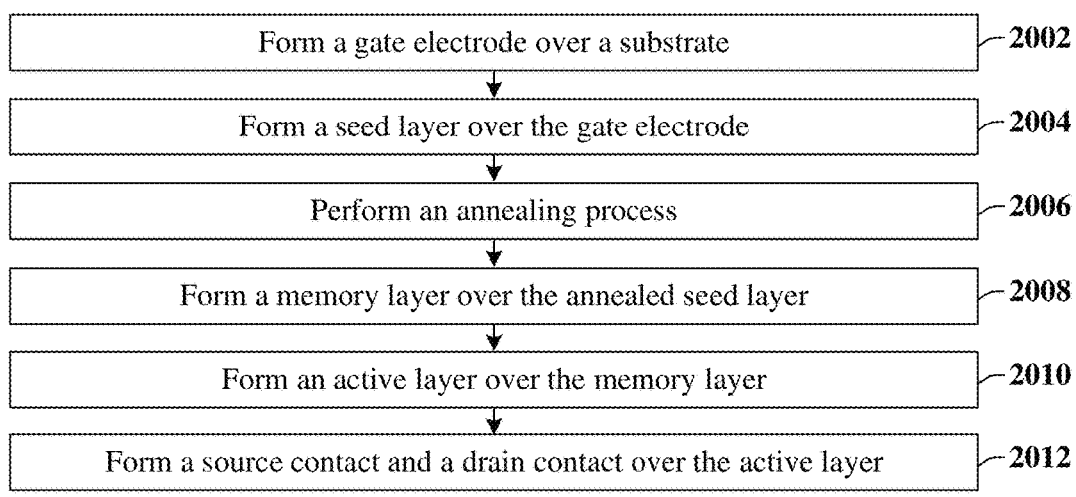
FIG. 20 illustrates a flow diagram of some embodiments of a method corresponding to FIGS. 6-19.

FIG. 20 illustrates a flow diagram of some embodiments of a method 2000 corresponding to the methods illustrated in FIGS. 6-19.

While method 2000 is illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At act 2002, a gate electrode is formed over a substrate. FIG. 6 illustrates a cross-sectional view 600 of some embodiments corresponding to act 2002.

At act 2004, a seed layer is formed over the gate electrode. FIG. 8 illustrates a cross-sectional view of some embodiments corresponding to act 2004.

At act 2006, an annealing process is performed. FIG. 9 illustrates cross-sectional view 900 of some embodiments corresponding to act 2006.

At act 2008, a memory layer is formed over the annealed seed layer. FIG. 14A illustrates cross-sectional view 1400A of some embodiments corresponding to act 2008.

At act 2010, an active layer is formed over the memory layer. FIG. 17 illustrates cross-sectional view 1700 of some embodiments corresponding to act 2010.

At act 2012, a source contact and a drain contact are formed over the active layer. FIG. 19 illustrates cross-sectional view 1900 of some embodiments corresponding to act 2012.

Therefore, the present disclosure relates to a method of annealing a seed layer in a FET FeRAM to increase the amount of the orthorhombic phase in the annealed seed layer such that when a memory layer is formed on the annealed seed layer, the memory layer has a higher amount of the orthorhombic phase to enhance the ferroelectric properties of the memory layer.

Accordingly, in some embodiments, the present disclosure relates to an integrated chip comprising: a first conductive structure arranged over a substrate; a memory layer arranged over the first conductive structure and comprising a ferroelectric material; a second conductive structure arranged over the memory layer; and an annealed seed layer arranged between the first and second conductive structures and directly on a first side of the memory layer, wherein an amount of the crystal structure of the annealed seed layer that comprises an orthorhombic phase is greater than 35 percent.

In other embodiments, the present disclosure relates to a method comprising: forming a first conductive layer over a substrate; forming a seed layer over the first conductive layer, wherein the seed layer comprises a crystal structure comprising multiple phases, and wherein a first value is equal to a percent of the crystal structure of the seed layer comprises an orthorhombic phase; performing an annealing process to form an annealed seed layer, wherein the annealed seed layer comprises a crystal structure comprising multiple phases, and wherein a second value is equal to a percent of the annealed seed layer comprises the orthorhombic phase, and wherein the second value is greater than the first value; forming a memory layer over the annealed seed layer; and forming a second conductive structure over the memory layer.

In yet other embodiments, the present disclosure relates to a method comprising: forming a gate electrode over a substrate; forming a seed layer over the gate electrode; performing an annealing process to form an annealed seed layer; forming a memory layer over the annealed seed layer; forming an active layer over the memory layer; and forming a source contact and a drain contact over the active layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
    forming a seed layer over a substrate;
    annealing the seed layer to form an annealed seed layer;
    forming a memory layer over the annealed seed layer, wherein the memory layer is epitaxially grown from the anneal seed layer; and
    forming a conductive structure over the memory layer;
    wherein a thickness of the seed layer before the annealing is the same as a thickness of the annealed seed layer upon completion of the annealing.

2. The method according to claim 1, further comprising:
    forming a conductive layer over the substrate, wherein the seed layer is formed over and directly on the conductive layer, and wherein a thickness of the conductive layer before the annealing is the same as a thickness of the conductive layer upon completion of the annealing.

3. The method according to claim 1, further comprising:
    forming a semiconductor layer overlying the memory layer, wherein the conductive structure is formed atop the semiconductor layer; and
    forming an additional conductive structure atop the semiconductor layer, laterally spaced from the conductive structure.

4. The method according to claim 1, wherein the seed layer is formed by atomic layer deposition (ALD) of material from an oxygen-gas source and only one solid-precursor plate, and wherein the memory layer is formed by ALD of material from the oxygen-gas source and two solid-precursor plates.

5. The method according to claim 4, wherein the seed layer and the memory layer both comprise material from a common solid-precursor plate.

6. The method according to claim 1, further comprising:
forming a conductive layer over the substrate, wherein the seed layer is formed over and directly on the conductive layer, and wherein a thickness of the conductive layer before the forming of the seed layer is greater than a thickness of the conductive layer upon completion of the forming of the seed layer.

7. The method according to claim 1, wherein the seed layer comprises metal oxide, and wherein the memory layer comprises hafnium zirconium oxide.

8. A method, comprising:
forming a seed layer overlying a substrate;
annealing the seed layer, wherein an orthorhombic crystalline phase increases in the seed layer from a beginning of the annealing to an end of the annealing;
forming a ferroelectric layer overlying and directly on the seed layer; and
forming a conductive structure overlying the ferroelectric layer;
wherein the forming of the seed layer and the annealing are performed within a common process chamber, wherein the forming of the seed layer comprises: adding a precursor vapor formed from an inert gas and a metal to the common process chamber; and adding an oxygen gas to the common process chamber after the adding the precursor vapor, and wherein the annealing is performed after the forming of the seed layer.

9. The method according to claim 8, further comprising:
forming a conductive layer over the substrate, wherein the seed layer is formed over and directly on the conductive layer; and
patterning the conductive layer, the seed layer, and the ferroelectric layer into a memory cell.

10. The method according to claim 9, wherein the seed layer is formed by oxidizing a top portion of the conductive layer.

11. The method according to claim 8, wherein the annealing begins after the seed layer is formed and ends before the ferroelectric layer is formed.

12. The method according to claim 8, wherein the seed layer comprises oxygen before the annealing.

13. The method according to claim 8, further comprising:
forming a semiconductor layer overlying the ferroelectric layer, wherein the conductive structure is formed overlying the semiconductor layer.

14. A method, comprising:
forming a conductive wire over a substrate;
forming a memory cell atop the conductive wire and comprising:
a ferroelectric seed layer;
a semiconductor layer overlying the ferroelectric seed layer; and
a ferroelectric memory layer between the ferroelectric seed layer and the semiconductor layer, and directly contacting the ferroelectric seed layer; and
forming an etch stop layer;
wherein the etch stop layer is on sidewalls of the ferroelectric seed layer, and further has a top surface and a bottom surface respectively recessed relative to a top surface of the ferroelectric memory layer and elevated relative to a top surface of the conductive wire, after the forming of the memory cell and the forming of the etch stop layer.

15. The method according to claim 14, wherein the ferroelectric seed layer and the etch stop layer have individual bottom surfaces level with each other after the forming of the memory cell and the forming of the etch stop layer.

16. The method according to claim 14, further comprising:
forming an additional etch stop layer overlying and directly contacting a top surface of the semiconductor layer, wherein the additional etch stop layer is spaced from the etch stop layer.

17. The method according to claim 14, further comprising:
forming an additional memory cell level with the memory cell and having another ferroelectric seed layer, which is spaced from the etch stop layer.

18. The method according to claim 8, wherein a thickness of the seed layer before the annealing is the same as a thickness of the seed layer upon completion of the annealing.

19. The method according to claim 8, wherein the forming of the seed layer further comprises forming the precursor vapor, which comprises flowing the inert gas over a solid precursor that comprises the metal and that is used during the forming of the ferroelectric layer.

20. The method according to claim 8, further comprising:
forming a conductive layer over the substrate, wherein the forming of the seed layer further comprises, before the adding of the precursor vapor, adding the oxygen gas to the common process chamber to oxidize a top portion of the conductive layer and to form a first layer of the seed layer from the top portion, and wherein the adding of the precursor vapor and the adding of the oxygen gas after the adding of the precursor vapor form a second layer of the seed layer atop the first layer of the seed layer.

* * * * *